United States Patent
Paudel et al.

(10) Patent No.: US 9,449,698 B1
(45) Date of Patent: Sep. 20, 2016

(54) BLOCK AND ZONE ERASE ALGORITHM FOR MEMORY

(71) Applicant: SanDisk Technologies Inc., Plano, TX (US)

(72) Inventors: Rajan Paudel, Fremont, CA (US); Jagdish Sabde, Fremont, CA (US); Sagar Magia, Milpitas, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/887,976

(22) Filed: Oct. 20, 2015

(51) Int. Cl.
  G11C 16/04 (2006.01)
  G11C 16/14 (2006.01)
  G11C 16/34 (2006.01)

(52) U.S. Cl.
  CPC .......... *G11C 16/14* (2013.01); *G11C 16/0483* (2013.01); *G11C 16/3436* (2013.01)

(58) Field of Classification Search
  CPC ... G11C 16/20; G11C 16/16; G11C 16/3445; G11C 16/3459; G11C 16/0416; G11C 16/10; G11C 16/14; G11C 16/3404; G11C 16/3409; G11C 16/345; G11C 16/26; G11C 16/30; G11C 7/10
  USPC ............ 365/185.33, 185.18, 185.22, 185.29, 365/200, 185.09, 185.24, 185.26, 185.3, 365/218
  See application file for complete search history.

(56) References Cited

U.S. PATENT DOCUMENTS

| 5,805,501 A * | 9/1998 | Shiau .................. G11C 16/16 365/185.29 |
|---|---|---|
| 6,891,752 B1 | 5/2005 | Bautista et al. |
| 7,495,954 B2 | 2/2009 | Ito |
| 7,606,100 B2 | 10/2009 | Hemink et al. |
| 7,636,259 B1 | 12/2009 | McLaury et al. |
| 7,768,826 B2 | 8/2010 | Ito |
| 7,804,718 B2 | 9/2010 | Kim |
| 7,835,190 B2 | 11/2010 | Sarin et al. |
| 8,339,861 B2 | 12/2012 | Chang et al. |
| 8,379,454 B2 | 2/2013 | Kochar et al. |
| 8,488,382 B1 | 7/2013 | Li et al. |
| 8,824,211 B1 | 9/2014 | Costa et al. |
| 8,891,308 B1 | 11/2014 | Ou et al. |
| 8,897,070 B2 | 11/2014 | Dong et al. |
| 8,908,444 B2 | 12/2014 | Costa et al. |
| 8,929,148 B2 | 1/2015 | Kim |
| 8,958,249 B2 | 2/2015 | Dutta et al. |
| 8,982,626 B2 | 3/2015 | Dong et al. |
| 9,025,389 B2 | 5/2015 | Kim |
| 9,036,428 B1 | 5/2015 | D'Abreu |
| 9,082,492 B2 | 7/2015 | Kwak |
| 2005/0041515 A1 | 2/2005 | Futatsuyama et al. |
| 2011/0199833 A1 | 8/2011 | Shim et al. |
| 2014/0226414 A1 | 8/2014 | Costa et al. |
| 2015/0003156 A1 | 1/2015 | Berckmann et al. |
| 2015/0117105 A1 | 4/2015 | Jung et al. |

* cited by examiner

*Primary Examiner* — Thong Q Le
(74) *Attorney, Agent, or Firm* — Vierra Magen Marcus LLP

(57) ABSTRACT

Techniques are provided for erasing a memory device. In one aspect, different zones of a block can be separately erased and subject to a verify test. Erase parameters can be optimized for each zone, so that endurance is improved. If one zone is found to be too slow to erase, it can be marked as being bad while other zones remain available for use. In another aspect, the zone-based erase occurs after a block based erased when a criterion is met, such as the block-based erase being too slow or failing to complete within an allowable number of program loops. The zone-based erase can occur after the block-based erase in the same erase operation, or in a subsequent, new erase operation.

20 Claims, 20 Drawing Sheets

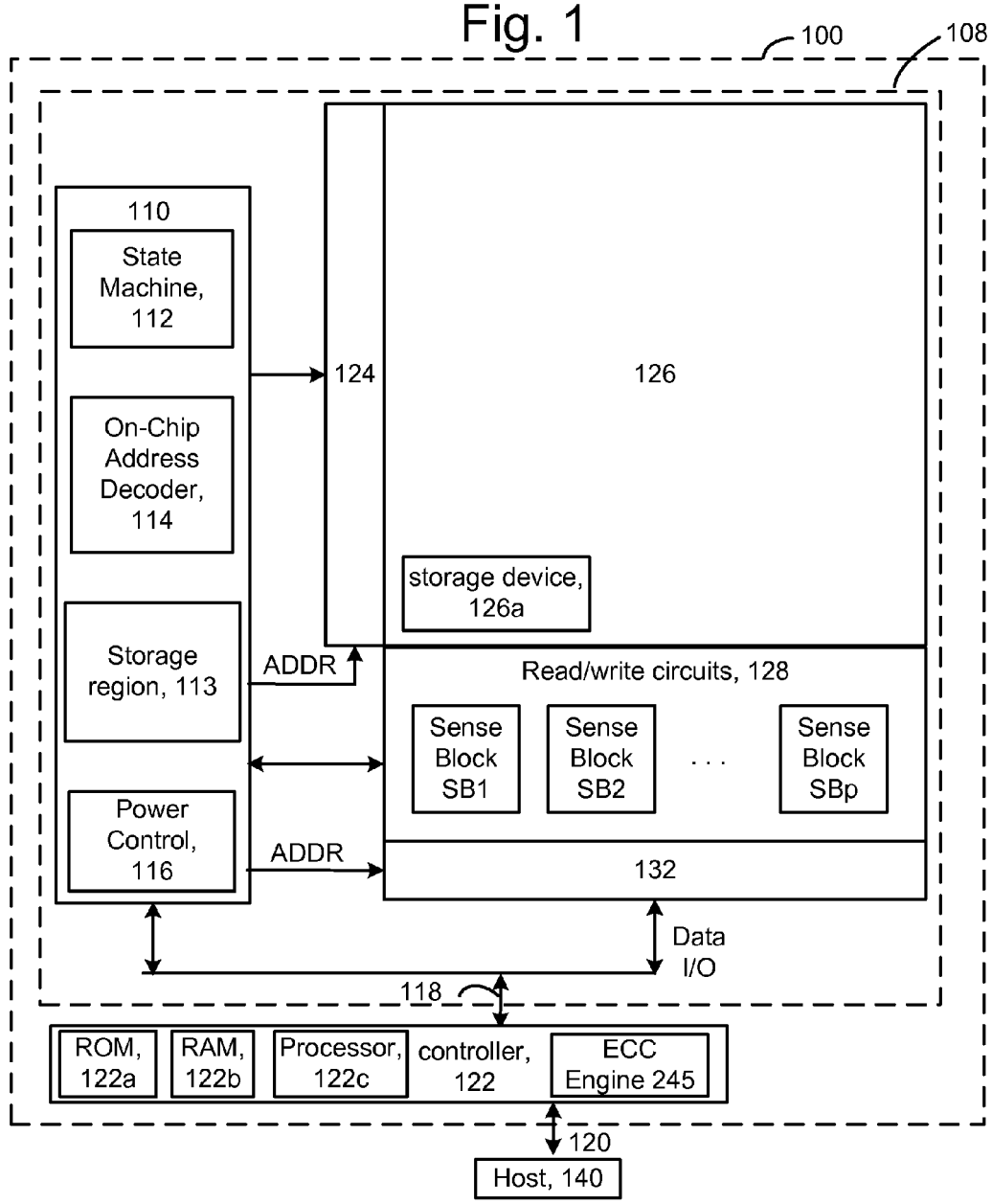

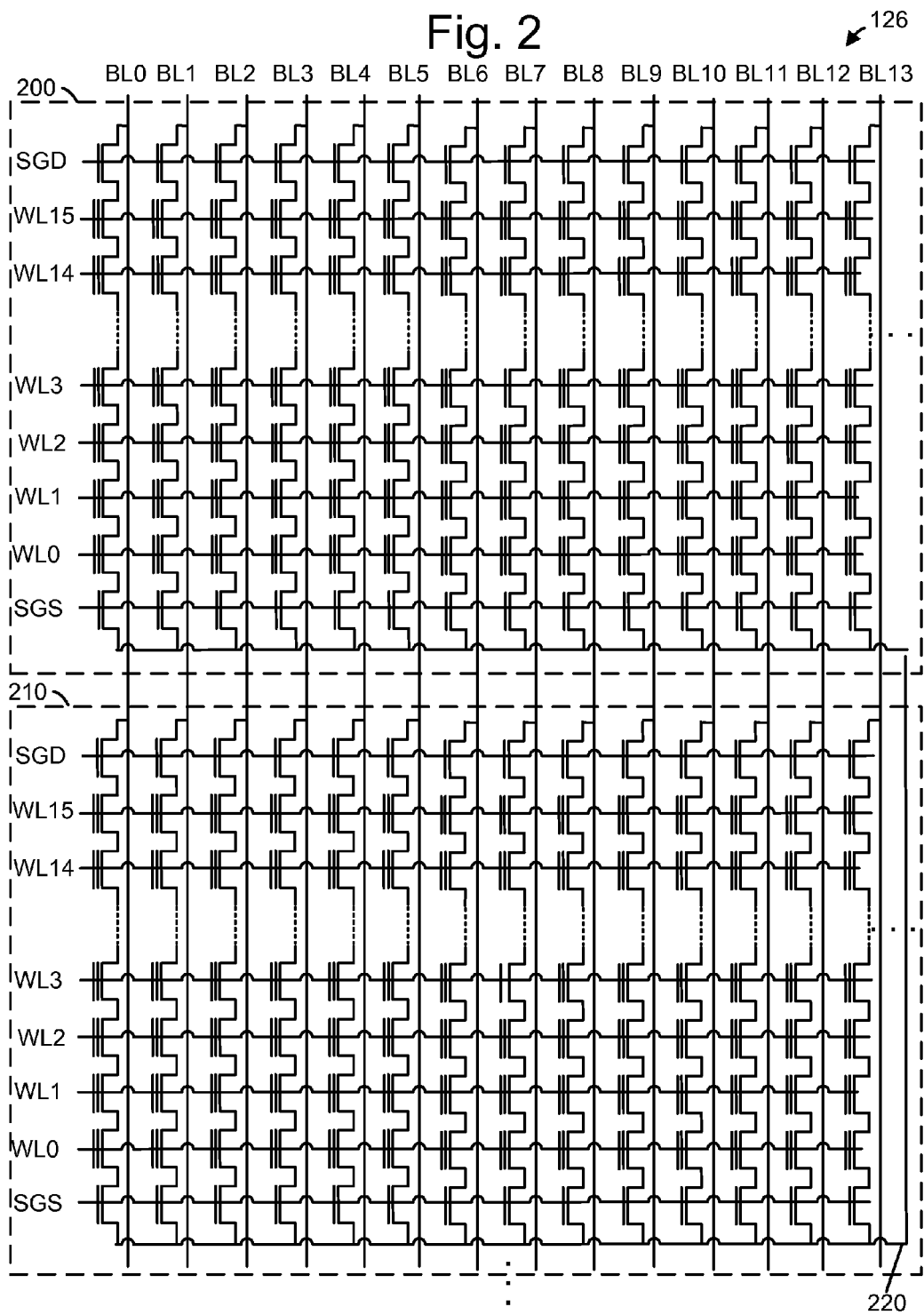

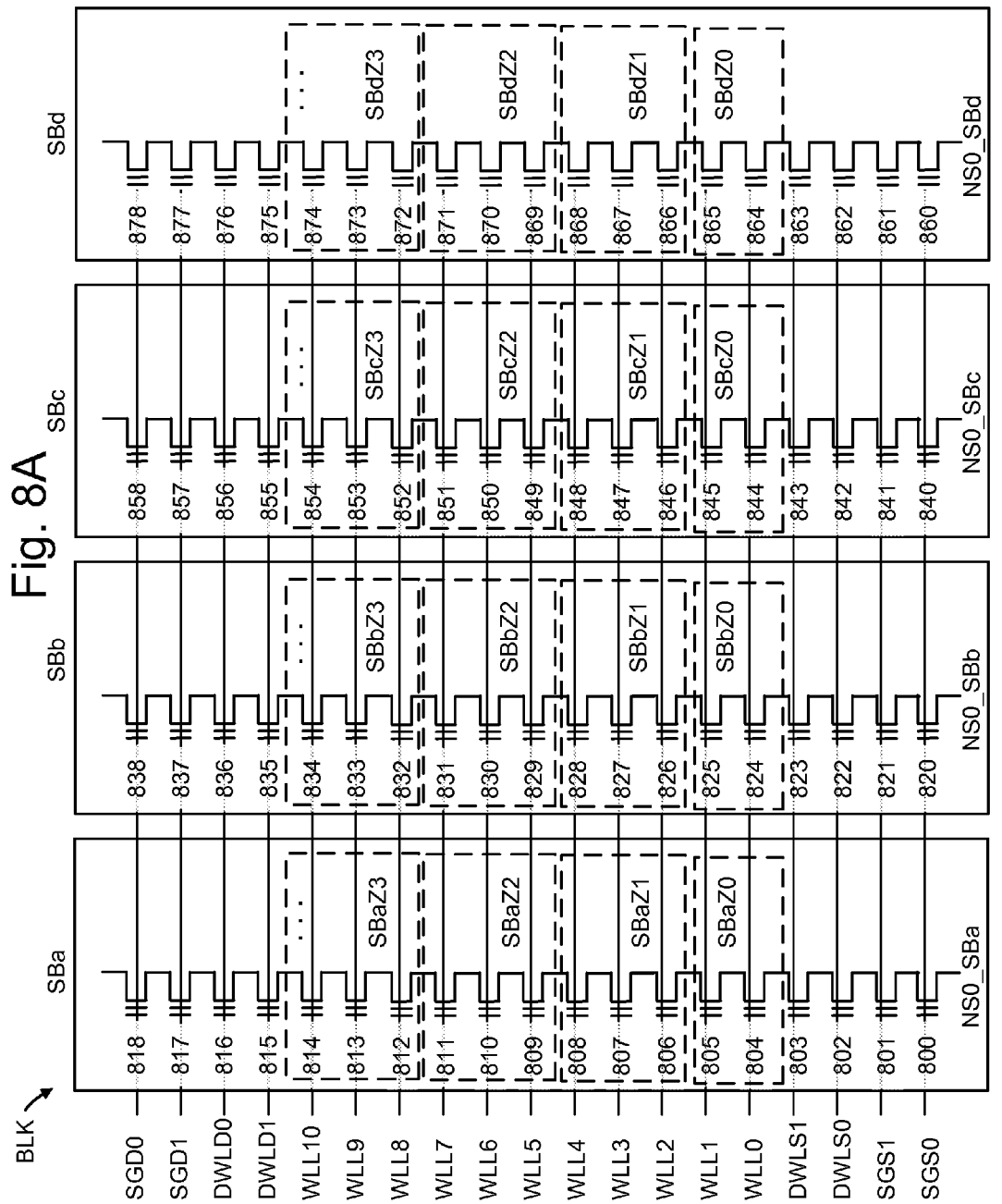

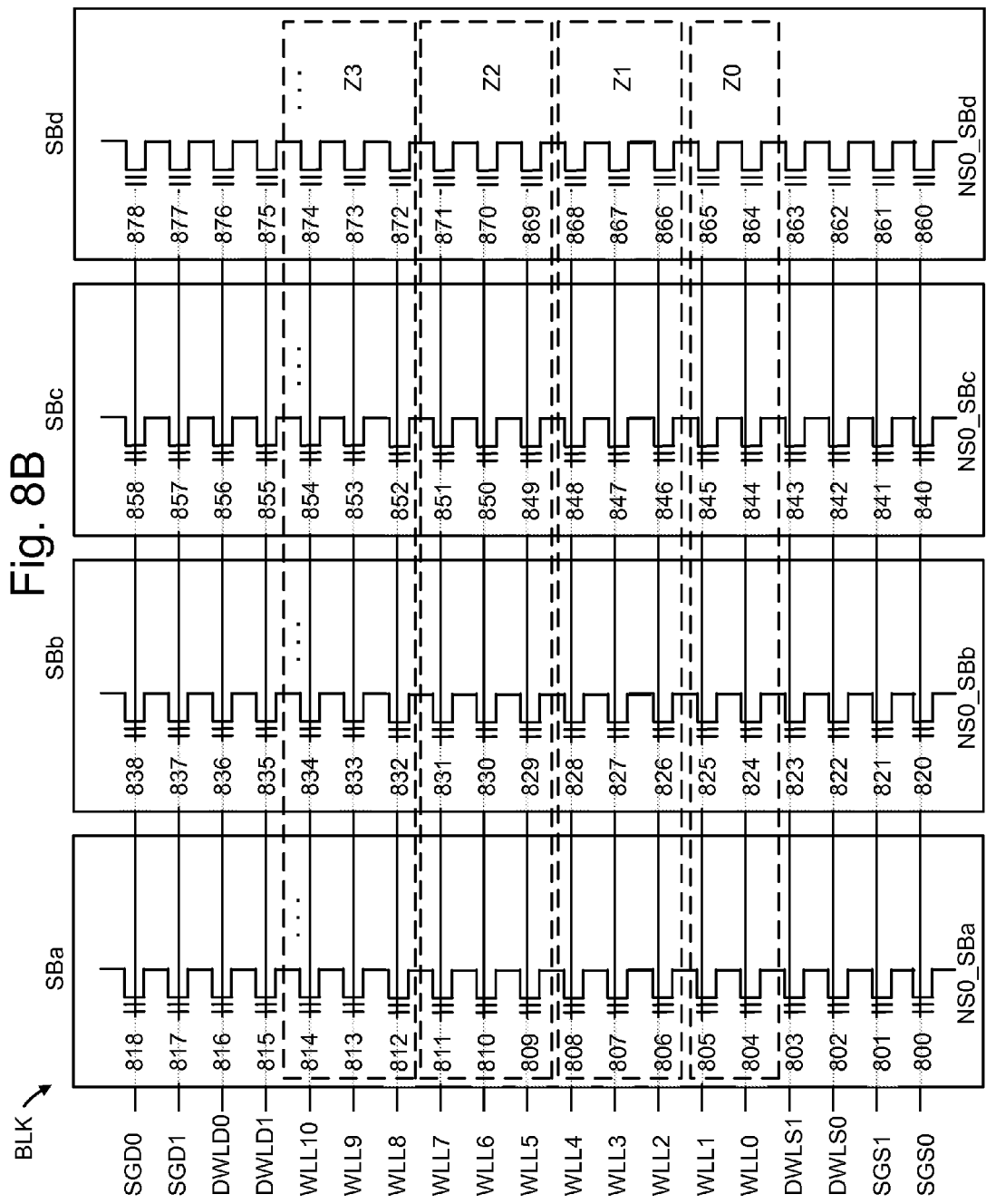

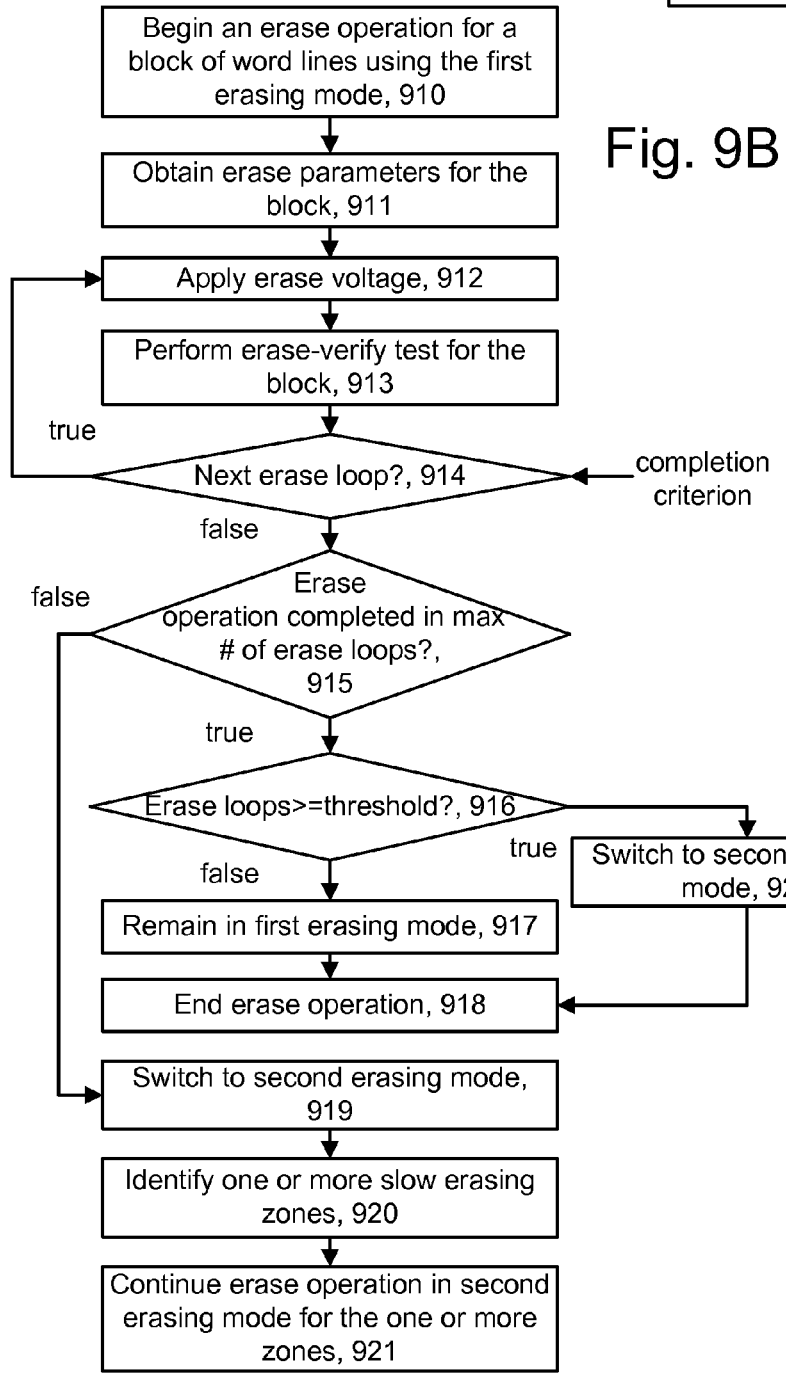

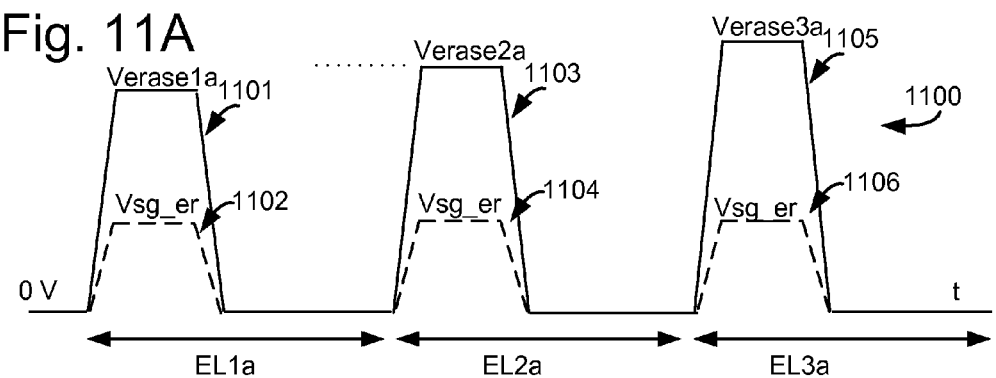
Fig. 11A
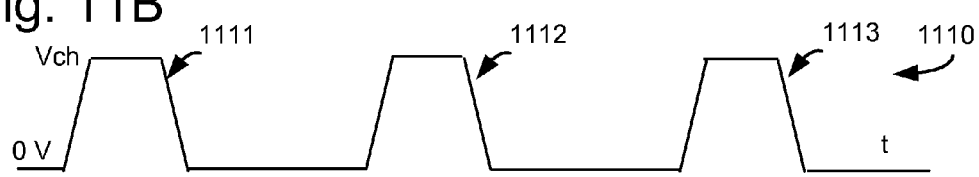
Fig. 11B
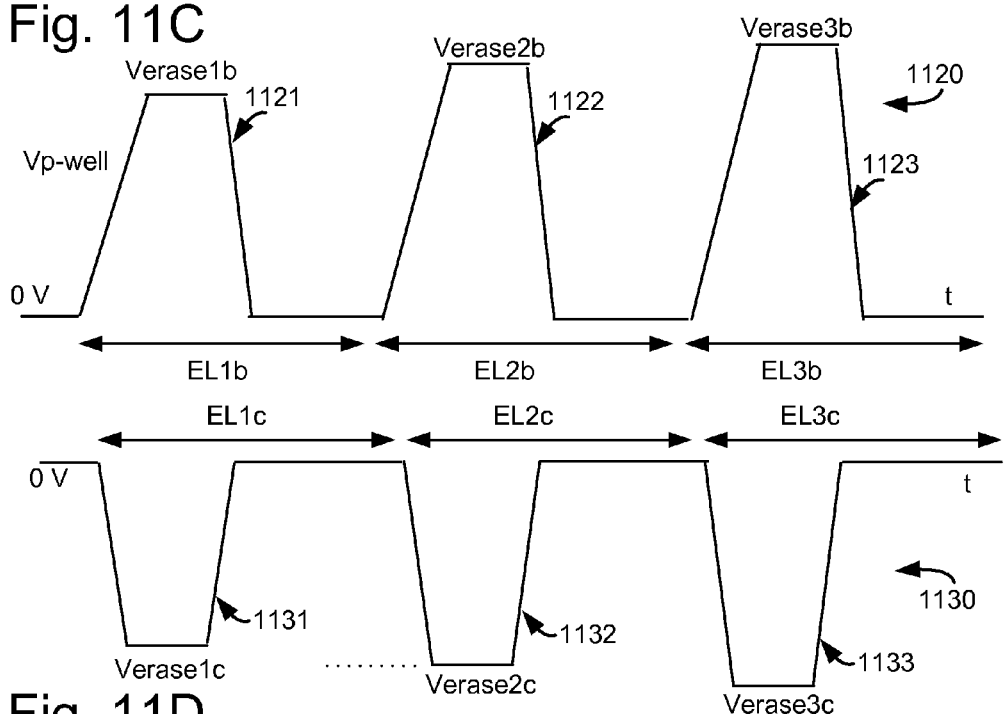
Fig. 11C
Fig. 11D
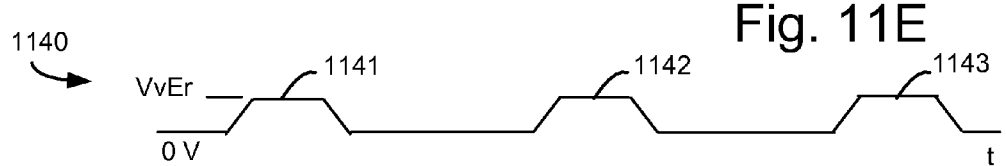
Fig. 11E

BLOCK AND ZONE ERASE ALGORITHM FOR MEMORY

BACKGROUND

The present technology relates to operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in strings, for instance, where select gate transistors are provided at the ends of the string to selectively connect a channel of the string to a source line or bit line. However, various challenges are presented in operating such memory devices.

BRIEF DESCRIPTION OF THE DRAWINGS

FIG. 1 is a block diagram of an example memory device.

FIG. 2 depicts blocks of memory cells in an example two-dimensional configuration of the memory array 126 of FIG. 1.

FIG. 8A depicts example NAND strings in the sub-blocks SBa-SBd of FIG. 7A, where the word lines are arranged in zones in each sub-block.

FIG. 8B depicts example NAND strings in the sub-blocks SBa-SBd of FIG. 7A, where the word lines are arranged in zones which extend across sub-blocks.

FIG. 9A is a flowchart of an example erase operation in a memory device.

FIG. 9B is a flowchart of an example erase operation using the first erasing mode of step 901 of FIG. 9A.

FIG. 11A depicts example voltages in an erase operation consistent with FIG. 9A, where the erase operation uses gate-induced drain leakage (GIDL) to charge up the channel of a NAND string.

FIG. 11B depicts an example channel voltage consistent with FIG. 11A.

FIG. 11C depicts example erase voltages in an erase operation consistent with FIG. 9A, where the erase operation applies a positive voltage to a p-well of a substrate.

FIG. 11D depicts example erase voltages in an erase operation consistent FIG. 9A, where the erase operation applies a negative voltage to the word lines in a block.

FIG. 11E depicts example verify voltages in an erase operation consistent with FIG. 9A.

DETAILED DESCRIPTION

Figure 3A:
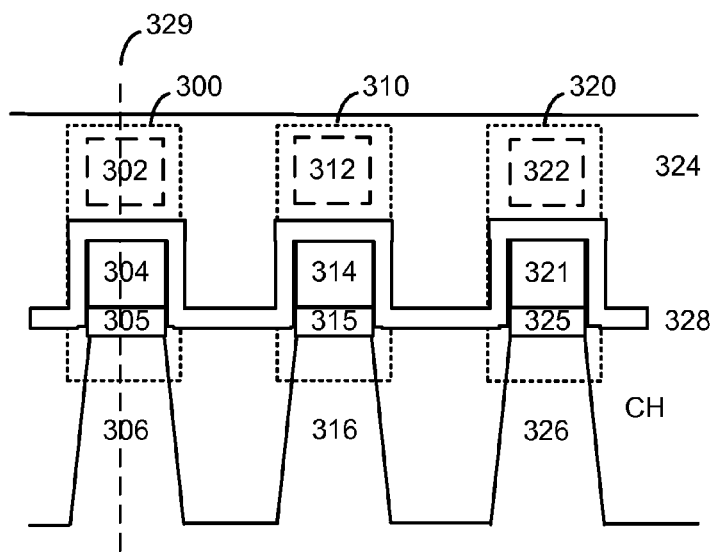
FIG. 3A depicts a cross-sectional view of example floating gate memory cells in NAND strings.

Techniques are provided for erasing a memory device in a way which increases endurance and which allows partial use of a block of memory cells when the block is slow to erase. A corresponding memory device is also provided.

In some memory devices, memory cells are joined to one another such as in NAND strings in a block or sub-block. Each NAND string comprises a number of memory cells connected in series between one or more drain-side SG transistors (SGD transistors), on a drain-side of the NAND string which is connected to a bit line, and one or more source-side SG transistors (SGS transistors), on a source-side of the NAND string which is connected to a source line. Further, the memory cells can be arranged with a common control line (e.g., word line) which acts a control gate. A set of word lines extends from the source side of a block to the drain side of a block.

An erase operation involves a set of memory cells, typically in a block in which memory cells are arranged along a plurality of word lines. During the erase operation, it is desired to lower the threshold voltage (Vth) of each memory cell below an erase-verify level which represents an erased data state. An erase operation can include a number of erase loops, where each loop comprises an erase portion follow by a verify test. In the erase portion, voltages are applied to the block to provide a positive channel-to-gate voltage for each memory cell of the block to drive electrons out of the charge-storing material of the cells, thereby reducing the Vth of the cells. In the verify test, a verify voltage is applied to the control gates of the memory cells via the word lines of the block, and sensing circuitry is used to sense currents in the NAND strings.

However, as the memory device accumulates program-erase cycles, the memory cells can become worn such that the number of slow to erase memory cells increases and the erase operation becomes more difficult to complete. For example, a relatively small number of slow-to-erase memory cells can result in a failure of the erase operation. Further, the slow-to-erase memory cells can be distributed throughout the block. This becomes problematic especially as the number of memory cells in a NAND string increases, since even one slow-to-erase memory cell will cause the NAND string to fail the verify test. For example, 3D memory devices may use 48, 64 or 96 memory cells in a NAND string. A block which cannot be erased is marked as being bad and can no longer be used.

Techniques provided herein address the above and other issues. In one aspect, different zones of a block can be separately erased and subject to a verify test. Erase parameters can be optimized for each zone, so that endurance is improved. If one zone is found to be too slow to erase, it can be marked as being bad/defective while other zones remain available for use. The erase operation can be optimized by biasing the word lines according to their zone. In another aspect, the zone-based erase occurs after a block based erased when a criterion is met, such as the block-based erase being too slow or failing to complete within an allowable number of program loops. The zone-based erase can occur after the block-based erase in the same erase operation, or in a subsequent, new erase operation. Techniques are also provided for identifying a zone which is slow to erase. For such a zone, its erase parameters can be adjusted to provide a stronger erase, or the zone can be marked as being bad.

Various other features and benefits are described below.

FIG. 1 is a block diagram of an example memory device. The memory device 100 may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, . . . , SBp (sensing circuitry) and allow a page of memory cells to be read or programmed in parallel. Typically a controller 122 is included in the same memory device 100 (e.g., a removable storage card) as the one or more memory die 108. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations. A storage region 113 may be provided, e.g., for erase parameters as described herein. The storage region can also store data which identifies bad word lines, zones or blocks as described further below, e.g., in connection with the process of FIG. 9A-9D. The number of PE cycles can also be stored.

The on-chip address decoder 114 provides an address interface between that used by the host or a memory controller to the hardware address used by the decoders 124 and 132. The power control module 116 controls the power and voltages supplied to the word lines and bit lines during memory operations. It can include drivers for word lines, SGS and SGD transistors and source lines. The sense blocks can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory structure 126, can be thought of as at least one control circuit which is configured to perform the techniques described herein including the steps of the flowchart of FIG. 9A. For example, a control circuit may include any one of, or a combination of, control circuitry 110, state machine 112, decoders 114/132, power control module 116, sense blocks SBb, SB2, . . . , SBp, read/write circuits 128, controller 122, and so forth.

The off-chip controller 122 may comprise a processor 122c, storage devices (memory) such as ROM 122a and RAM 122b and an error-correction code (ECC) engine 245. The ECC engine can correct a number of read errors which are caused when the upper tail of a Vth distribution becomes too high.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements. The columns may be arranged in a two dimensional configuration, e.g., in an x-y plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the two dimensional and three dimensional exemplary structures described but covers all relevant memory structures within the spirit and scope of the technology as described herein and as understood by one of skill in the art.

FIG. 2 depicts blocks of memory cells in an example two-dimensional configuration of the memory array 126 of FIG. 1. The memory array can include many blocks. Each example block 200, 210 includes a number of NAND strings and respective bit lines, e.g., BL0, BL1, . . . which are shared among the blocks. Each NAND string is connected at one end to a drain select gate (SGD), and the control gates of the drain select gates are connected via a common SGD line. The NAND strings are connected at their other end to a source select gate which, in turn, is connected to a common source line 220. Sixteen word lines, for example, WL0-WL15, extend between the source select gates and the drain select gates. In some cases, dummy word lines, which contain no user data, can also be used in the memory array adjacent to the select gate transistors. Such dummy word lines can shield the edge data word line from certain edge effects.

One type of non-volatile memory which may be provided in the memory array is a floating gate memory. See FIGS. 3A and 3B. Other types of non-volatile memory can also be used. For example, a charge-trapping memory cell uses a non-conductive dielectric material in place of a conductive floating gate to store charge in a non-volatile manner. See FIGS. 4A and 4B. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

FIG. 3A depicts a cross-sectional view of example floating gate memory cells in NAND strings. A bit line or NAND string direction goes into the page, and a word line direction goes from left to right. As an example, word line 324 extends across NAND strings which include respective channel regions 306, 316 and 326. The memory cell 300 includes a control gate 302, a floating gate 304, a tunnel oxide layer 305 and the channel region 306. The memory cell 310 includes a control gate 312, a floating gate 314, a tunnel oxide layer 315 and the channel region 316. The memory cell 320 includes a control gate 322, a floating gate 321, a tunnel oxide layer 325 and the channel region 326. Each memory cell is in a different respective NAND string. An inter-poly dielectric (IPD) layer 328 is also depicted. The control gates are portions of the word line. A cross-sectional view along line 329 is provided in FIG. 3B.

Figure 4A:
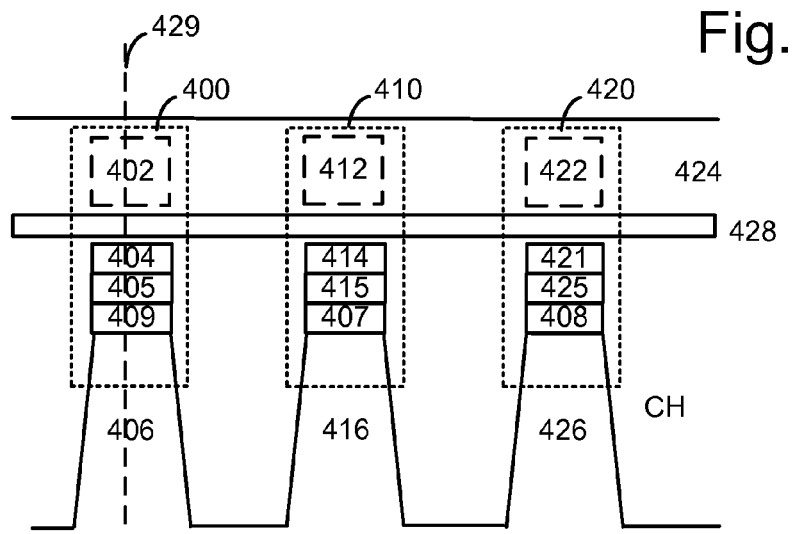
FIG. 4A depicts a cross-sectional view of example charge-trapping memory cells in NAND strings.
Figure 4B:
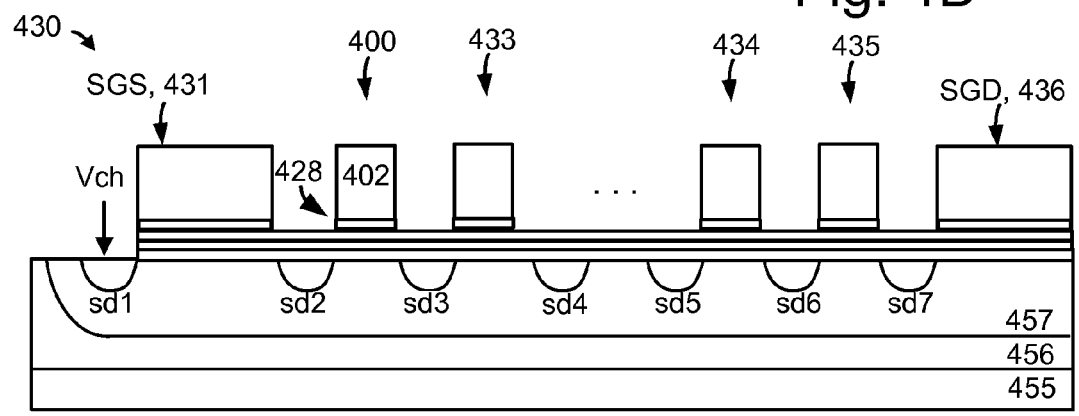
FIG. 4B depicts a cross-sectional view of the structure of FIG. 4A along line 429.

The control gate wraps around the floating gate, increasing the surface contact area between the control gate and floating gate. This results in higher IPD capacitance, leading to a higher coupling ratio which makes programming and erase easier. However, as NAND memory devices are scaled down, the spacing between neighboring cells becomes smaller so there is almost no space for the control gate and the IPD between two adjacent floating gates. As an alternative, as shown in FIGS. 4A and 4B, the flat or planar memory cell has been developed in which the control gate is flat or planar; that is, it does not wrap around the floating gate, and its only contact with the charge storage layer is from above it. In this case, there is no advantage in having a tall floating gate. Instead, the floating gate is made much thinner. Further, the floating gate can be used to store charge, or a thin charge trap layer can be used to trap charge. This approach can avoid the issue of ballistic electron transport, where an electron can travel through the floating gate after tunneling through the tunnel oxide during programming.

Figure 3B:
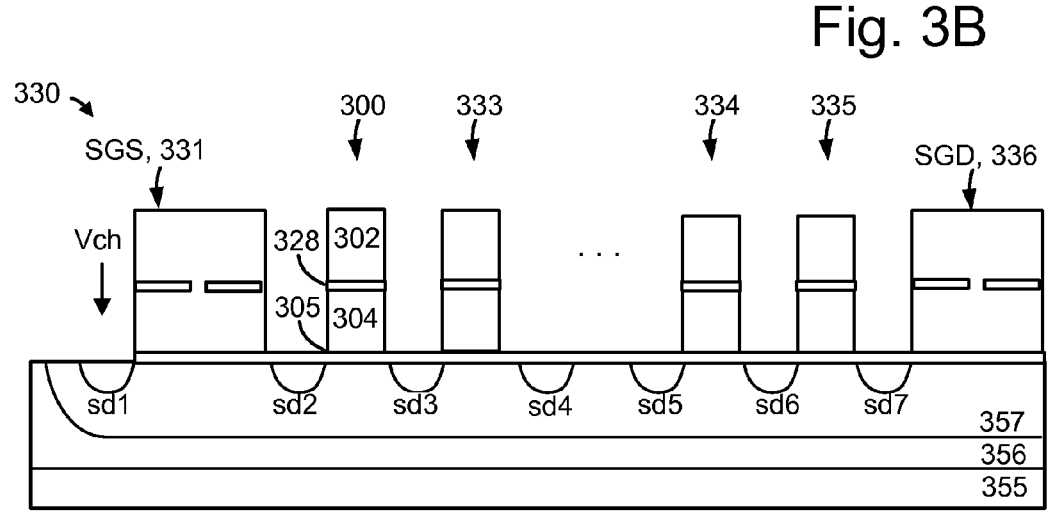
FIG. 3B depicts a cross-sectional view of the structure of FIG. 3A along line 329.

FIG. 3B depicts a cross-sectional view of the structure of FIG. 3A along line 329. The NAND string 330 includes an SGS transistor 331, example memory cells 300, 333, . . . , 334 and 335, and an SGD transistor 336. The memory cell 300, as an example of each memory cell, includes the control gate 302, the IPD layer 328, the floating gate 304 and the tunnel oxide layer 305, consistent with FIG. 3A. Passageways in the IPD layer in the SGS and SGD transistors allow the control gate layers and floating gate layers to communicate. The control gate and floating gate layers may be polysilicon and the tunnel oxide layer may be silicon oxide, for instance. The IPD layer can be a stack of nitrides (N) and oxides (0) such as in a N—O—N—O—N configuration.

The NAND string may be formed on a substrate which comprises a p-type substrate region 355, an n-type well 356 and a p-type well 357. N-type source/drain diffusion regions sd1, sd2, sd3, sd4, sd5, sd6 and sd7 are formed in the p-type well. A channel voltage, Vch, may be applied directly to the channel region of the substrate.

FIG. 4A depicts a cross-sectional view of example charge-trapping memory cells in NAND strings. The view is in a word line direction of memory cells comprising a flat control gate and charge-trapping regions as a 2D example of memory cells in the memory cell array 126 of FIG. 1. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line (WL) 424 extends across NAND strings which include respective channel regions 406, 416 and 426. Portions of the word line provide control gates 402, 412 and 422. Below the word line is an IPD layer 428, charge-trapping layers 404, 414 and 421, polysilicon layers 405, 415 and 425 and tunneling layer layers 409, 407 and 408. Each charge-trapping layer extends continuously in a respective NAND string.

A memory cell 400 includes the control gate 402, the charge-trapping layer 404, the polysilicon layer 405 and a portion of the channel region 406. A memory cell 410 includes the control gate 412, the charge-trapping layer 414, a polysilicon layer 415 and a portion of the channel region 416. A memory cell 420 includes the control gate 422, the charge-trapping layer 421, the polysilicon layer 425 and a portion of the channel region 426.

A flat control gate is used here instead of a control gate that wraps around a floating gate. One advantage is that the charge-trapping layer can be made thinner than a floating gate. Additionally, the memory cells can be placed closer together.

FIG. 4B depicts a cross-sectional view of the structure of FIG. 4A along line 429. The view shows a NAND string 430 having a flat control gate and a charge-trapping layer. The NAND string 430 includes an SGS transistor 431, example memory cells 400, 433, . . . , 434 and 435, and an SGD transistor 436.

The NAND string may be formed on a substrate which comprises a p-type substrate region 455, an n-type well 456 and a p-type well 457. N-type source/drain diffusion regions sd1, sd2, sd3, sd4, sd5, sd6 and sd7 are formed in the p-type well 457. A channel voltage, Vch, may be applied directly to the channel region of the substrate. The memory cell 400 includes the control gate 402 and the IPD layer 428 above the charge-trapping layer 404, the polysilicon layer 405, the tunneling layer 409 and the channel region 406.

The control gate layer may be polysilicon and the tunneling layer may be silicon oxide, for instance. The IPD layer can be a stack of high-k dielectrics such as AlOx or HfOx which help increase the coupling ratio between the control gate layer and the charge-trapping or charge storing layer. The charge-trapping layer can be a mix of silicon nitride and oxide, for instance.

The SGD and SGS transistors have the same configuration as the memory cells but with a longer channel length to ensure that current is cutoff in an inhibited NAND string.

In this example, the layers 404, 405 and 409 extend continuously in the NAND string. In another approach, portions of the layers 404, 405 and 409 which are between the control gates 402, 412 and 422 can be removed, exposing a top surface of the channel 406.

Figure 5:
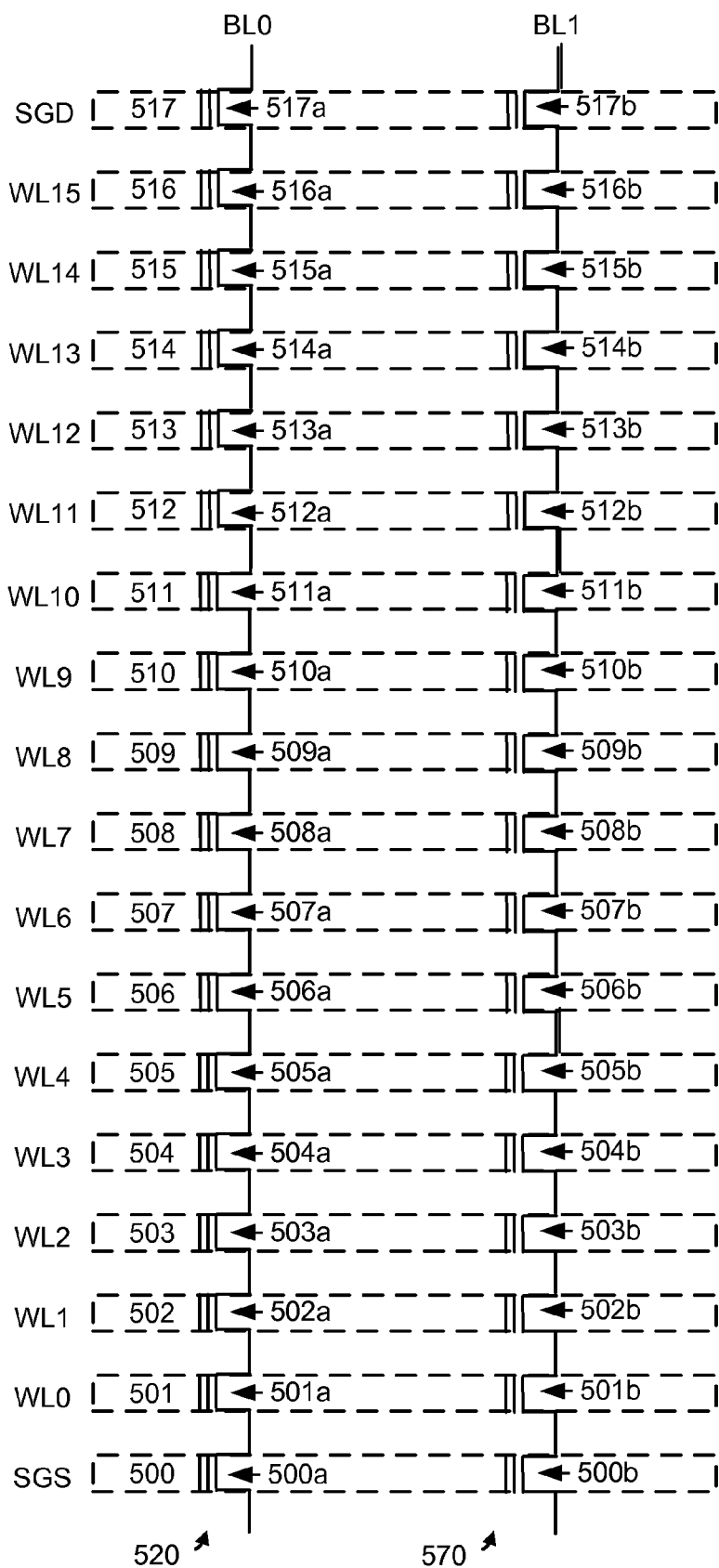
FIG. 5 depicts the block 200 of FIG. 2, showing the word lines.

FIG. 5 depicts the block 200 of FIG. 2, showing the word lines. Example NAND strings 520 and 570 are depicted. Control gate lines include word lines and select gate lines. The control gate lines are, in order from the source side of the block to the drain side of the block: SGS line 500, WL0 501, WL1 502, WL2 503, WL3 504, WL4 505, WL5 506, WL6 507, WL7 508, WL8 509, WL9 510, WL10 511, WL11 512, WL12 513, WL13 514, WL14 515 and WL15 516 and SGD line 517.

The SGS lines 500 and 517 are connected to select gate transistors 500a and 517a, respectively, in NAND string 520. The word lines WL0 501, WL1 502, WL2 503, WL3 504, WL4 505, WL5 506, WL6 507, WL7 508, WL8 509, WL9 510, WL10 511, WL11 512, WL12 513, WL13 514, WL14 515 and WL15 516 are connected to memory cells 501a, 502a, 503a, 504a, 505a, 506a, 507a, 508a, 509a, 510a, 511a, 512a, 513a, 514a, 515a and 516a, respectively, in NAND string 520.

Similarly, the SGS lines 500 and 517 are connected to select gate transistors 500b and 517b, respectively, in NAND string 570. The word lines WL0 501, WL1 502, WL2 503, WL3 504, WL4 505, WL5 506, WL6 507, WL7 508, WL8 509, WL9 510, WL10 511, WL11 512, WL12 513, WL13 514, WL14 515 and WL15 516 are connected to memory cells 501b, 502b, 503b, 504b, 505b, 506b, 507b, 508b, 509b, 510b, 511b, 512b, 513b, 514b, 515b and 516b, respectively, in NAND string 520.

Figure 6A:
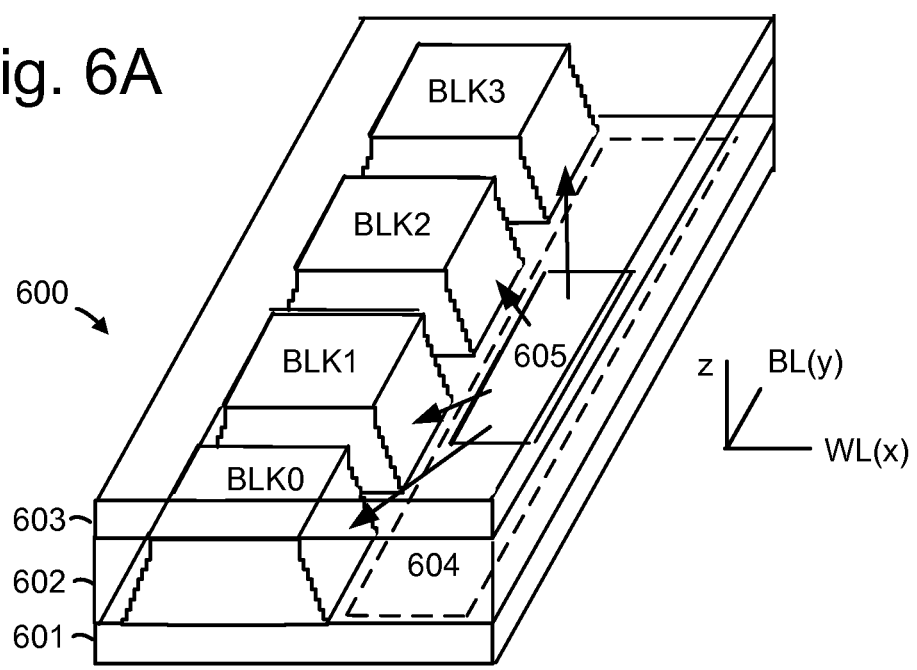
FIG. 6A is a perspective view of a memory comprising a set of blocks in an example three-dimensional configuration of the memory array 126 of FIG. 1.

FIG. 6A is a perspective view of a memory device 600 comprising a set of blocks in an example three-dimensional configuration of the memory array 126 of FIG. 1. On the substrate are example blocks BLK0, BLK1, BLK2 and BLK3 of memory cells (storage elements) and a peripheral area 604 with circuitry for use by the blocks. For example, the circuitry can include voltage drivers 605 which can be connected to control gate layers of the blocks. In one approach, control gate layers at a common height in the blocks are commonly driven. The substrate 601 can also carry circuitry under the blocks, along with one or more lower metal layers which are patterned in conductive paths to carry signals of the circuitry. The blocks are formed in an intermediate region 602 of the memory device. In an upper region 603 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 6B:
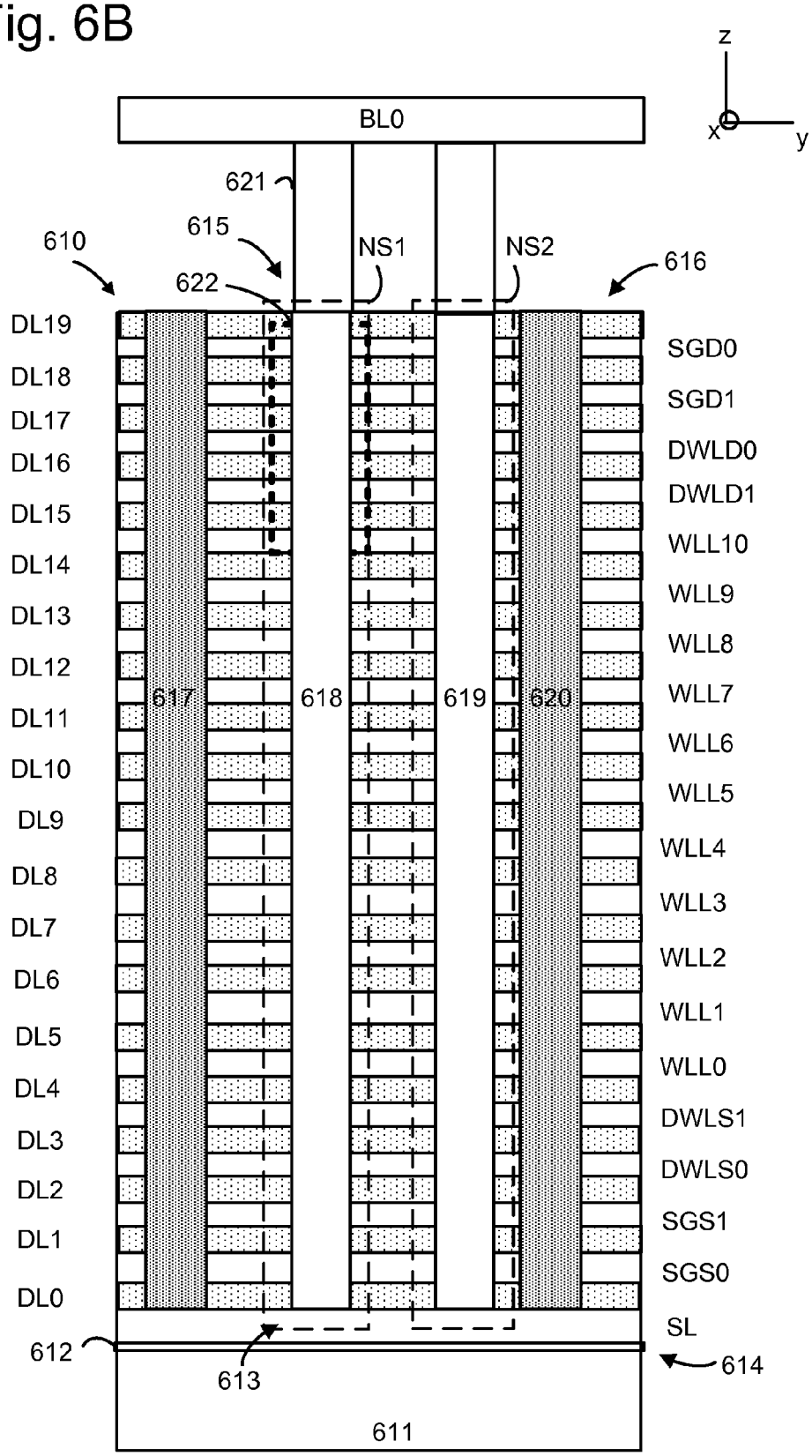
FIG. 6B depicts an example cross-sectional view of a portion of one of the blocks of FIG. 6A.

FIG. 6B depicts an example cross-sectional view of a portion of one of the blocks of FIG. 6A. The block comprises a stack 610 of alternating conductive and dielectric layers. In this example, the conductive layers comprise two SGD layers, two SGS layers and four dummy word line layers DWLD0, DWLD1, DWLS0 and DWLS1, in addition to data word line layers (word lines) WLL0-WLL10. The dielectric layers are labelled as DL0-DL19. Further, regions of the stack which comprise NAND strings NS1 and NS2 are depicted. Each NAND string encompasses a memory hole 618 or 619 which is filled with materials which form memory cells adjacent to the word lines. A region 622 of the stack is shown in greater detail in FIG. 6D.

The stack includes a substrate 611, an insulating film 612 on the substrate, and a portion of a source line SL. NS1 has a source-end 613 at a bottom 614 of the stack and a drain-end 615 at a top 616 of the stack. Metal-filled slits 617 and 620 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 621 connects the drain-end 615 to BL0.

Figure 6C:
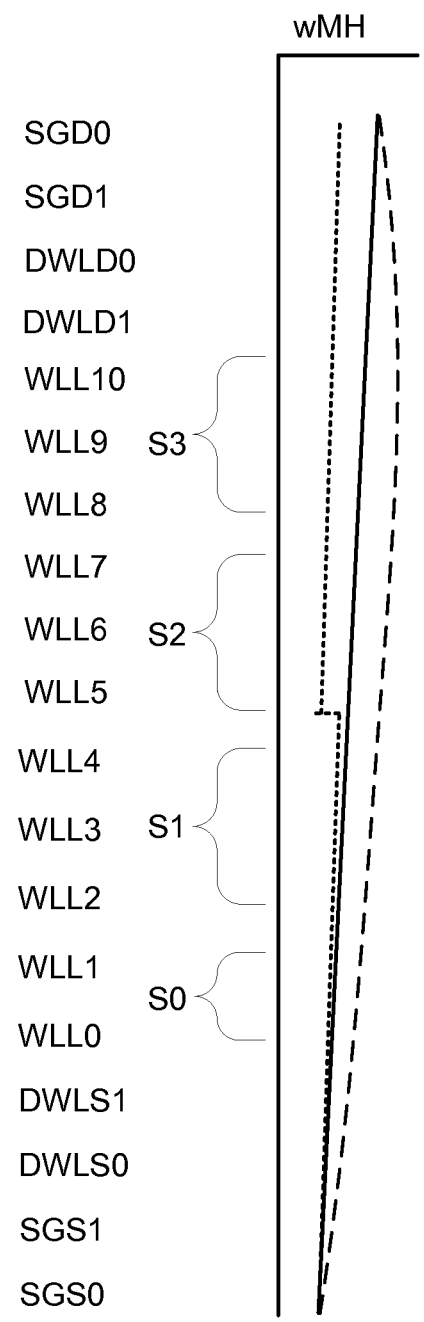
FIG. 6C depicts a plot of memory hole diameter in the stack of FIG. 6B.

FIG. 6C depicts a plot of memory hole diameter in the stack of FIG. 6B. The vertical axis is aligned with the stack of FIG. 6B and depicts a width (wMH), e.g., diameter, of the memory holes 618 and 619. In such a memory device, the memory holes which are etched through the stack have a very high aspect ratio. For example, a depth-to-diameter ratio of about 25-30 is common. The memory holes may have a circular cross-section. Due to the etching process, the memory hole width can vary along the length of the hole. Typically, the diameter becomes progressively smaller from the top to the bottom of the memory hole (solid line in FIG. 6C). That is, the memory holes are tapered, narrowing at the bottom of the stack. In some cases, a slight narrowing occurs at the top of the hole near the select gate so that the diameter becomes slight wider before becoming progressively smaller from the top to the bottom of the memory hole (long dashed line in FIG. 6C). For example, the memory hole width is a maximum at the level of WL9 in the stack, in this example. The memory hole width is slightly smaller at the level of WL10, and progressively smaller at the levels of WL8 to WL0.

In another possible implementation, represented by the short dashed line, the stack is fabricated in two tiers. The bottom tier is formed first with a respective memory hole. The top tier is then formed with a respective memory hole which is aligned with the memory hole in the bottom tier. Each memory hole is tapered such that a double tapered memory hole is formed in which the width increases, then decreases and increases again, moving from the bottom of the stack to the top. Respective zones Z0, Z1, Z2 and Z3 are also depicted, as discussed further below.

Due to the non-uniformity in the width of the memory hole, the programming and erase speed of the memory cells can vary based on their position along the memory hole, e.g., based on their height in the stack. With a smaller diameter memory hole, the electric field across the tunnel oxide is relatively stronger, so that the programming and erase speed is relatively higher.

A block may comprise a three-dimensional structure in which the memory cells are arranged along vertical memory holes, the vertical memory holes have varying diameters; and each subset is associated with portions of the vertical memory holes having similar diameters.

Figure 6D:
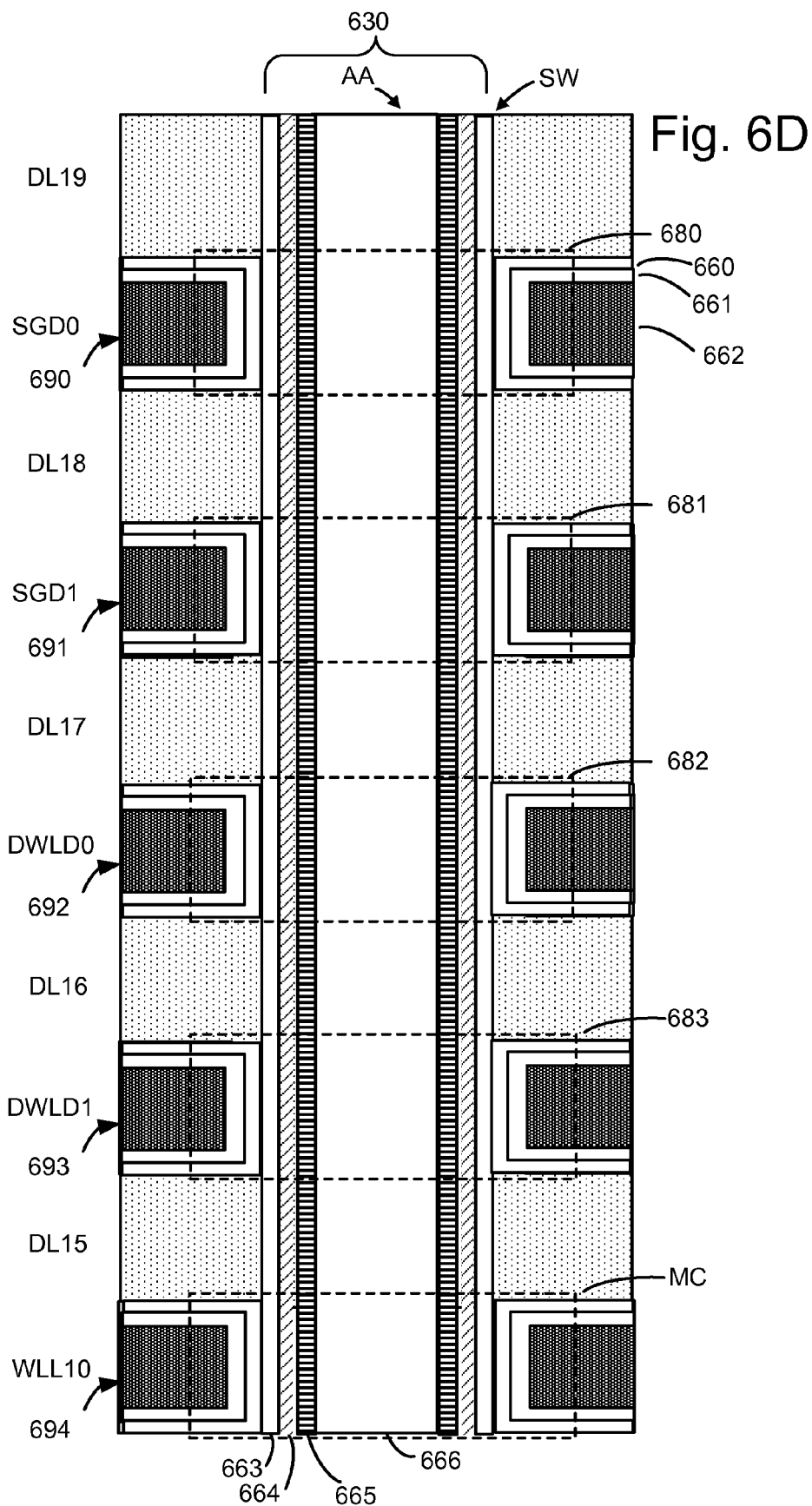
FIG. 6D depicts a close-up view of the region 622 of the stack of FIG. 6B.

FIG. 6D depicts a close-up view of the region 622 of the stack of FIG. 6B. Memory cells are formed at the different levels of the stack at the intersection of a word line layer and a memory hole. In this example, SGD transistors 680 and 681 are provided above dummy memory cells 682 and 683 and a data memory cell MC. A number of layers can be deposited along the sidewall (SW) of the memory hole 630 and/or within each word line layer, e.g., using atomic layer deposition. For example, each column (e.g., the pillar which is formed by the materials within a memory hole) can include a charge-trapping layer or film 663 such as SiN or other nitride, a tunneling layer 664, a polysilicon body or channel 665, and a dielectric core 666. A word line layer can include a blocking oxide/block high-k material 660, a metal barrier 661, and a conductive metal 662 such as Tungsten as a control gate. For example, control gates 690, 691, 692, 693 and 694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

Figure 7A:
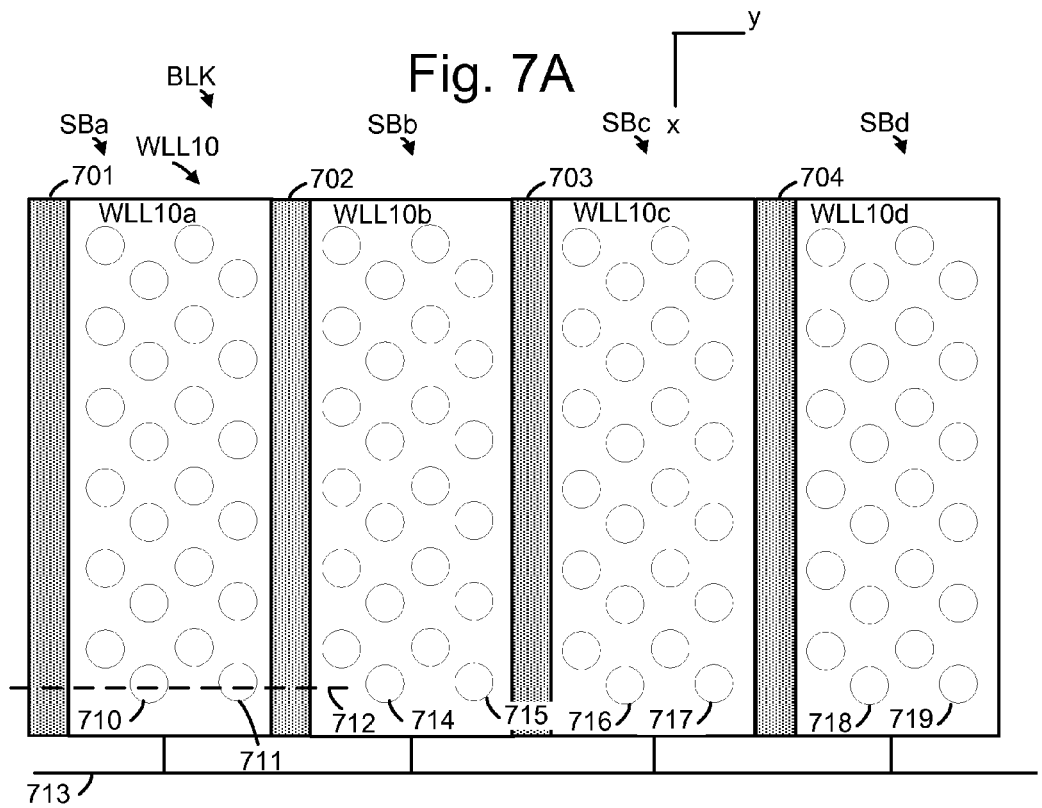
FIG. 7A depicts a top view of an example word line layer WLL10 of the stack of FIG. 6B.

FIG. 7A depicts a top view of an example word line layer WLL10 of the stack of FIG. 6B. As mentioned, a 3D memory device can comprise a stack of alternating conductive and dielectric layers. The conductive layers provide the control gates of the SG transistors and memory cells. The layers used for the SG transistors are SG layers and the layers used for the memory cells are word line layers. Further, memory holes are formed in the stack and filled with a charge-trapping material and a channel material. As a result, a vertical NAND string is formed. Source lines are connected to the NAND strings below the stack and bit lines are connected to the NAND strings above the stack.

A block BLK in a 3D memory device can be divided into sub-blocks, where each sub-block comprises a set of NAND string which have a common SGD control line. Further, a word line layer in a block can be divided into regions. Each region can extend between slits which are formed periodically in the stack to process the word line layers during the fabrication process of the memory device. This processing can include replacing a sacrificial material of the word line layers with metal. Generally, the distance between slits should be relatively small to account for a limit in the distance that an etchant can travel laterally to remove the sacrificial material, and that the metal can travel to fill a void which is created by the removal of the sacrificial material. For example, the distance between slits may allow for a few rows of memory holes between adjacent slits. The layout of the memory holes and slits should also account for a limit in the number of bit lines which can extend across the region while each bit line is connected to a different memory cell. After processing the word line layers, the slits can optionally be filed with metal to provide an interconnect through the stack.

This figures and other are not necessarily to scale. In practice, the regions can be much longer in the x-direction relative to the y-direction than is depicted to accommodate additional memory holes.

In this example, there are four rows of memory holes between adjacent slits. A row here is a group of memory holes which are aligned in the x-direction. Moreover, the rows of memory holes are in a staggered pattern to increase the density of the memory holes. The word line layer is divided into regions WLL10a, WLL10b, WLL10c and WLL10d which are each connected by a connector 713. The last region of a word line layer in a block can be connected to a first region of a word line layer in a next block, in one approach. The connector, in turn, is connected to a voltage driver for the word line layer. The region WLL10a has example memory holes 710 and 711 along a line 712. See also FIGS. 7B and 8A. The region WLL10b has example memory holes 714 and 715. The region WLL10c has example memory holes 716 and 717. The region WLL10d has example memory holes 718 and 719. Each memory hole can be part of a respective NAND string. For example, the memory holes 710, 714, 716 and 718 can be part of NAND strings NS0_SBa, NS0_SBb, NS0_SBc and NS0_SBd, respectively.

Each circle represents the cross-section of a memory hole at a word line layer or SG layer. Each circle can alternatively represent a memory cell which is provided by the materials in the memory hole and by the adjacent word line layer.

Metal-filled slits 701, 702, 703 and 704 (e.g., metal interconnects) may be located between and adjacent to the edges of the regions WLL10a-WLL10d. The metal-filled slits provide a conductive path from the bottom of the stack to the top of the stack. For example, a source line at the bottom of the stack may be connected to a conductive line above the stack, where the conductive line is connected to a voltage driver in a peripheral region of the memory device. See also FIG. 8A for further details of the sub-blocks SBa-SBd of FIG. 7A.

Figure 7B:
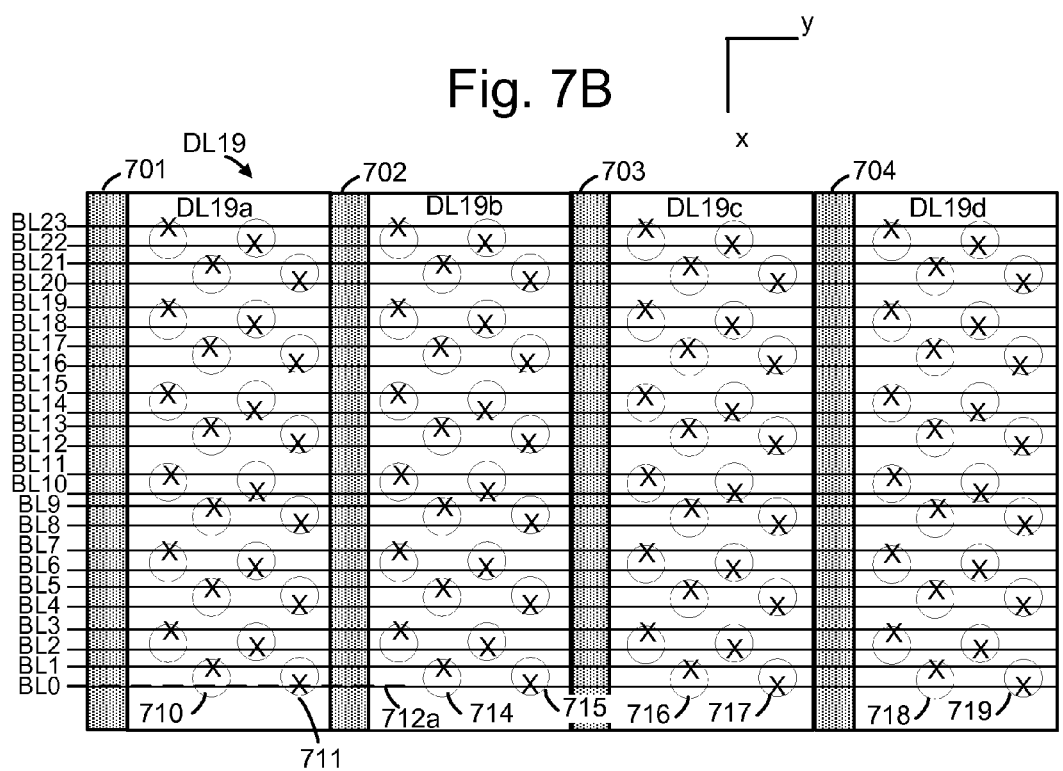
FIG. 7B depicts a top view of an example top dielectric layer DL19 of the stack of FIG. 6B.

FIG. 7B depicts a top view of an example top dielectric layer DL19 of the stack of FIG. 6B. The dielectric layer is divided into regions DL19a, DL19b, DL19c and DL19d. Each region can be connected to a respective voltage driver. This allows a set of memory cells in one region of a word line layer to be programmed concurrently, with each memory cell being in a respective NAND string which is connected to a respective bit line. A voltage can be set on each bit line to allow or inhibit programming during each program voltage.

The region DL19a has the example memory holes 710 and 711 along a line 712a which is coincident with a bit line BL0. A number of bit lines extend above the memory holes and are connected to the memory holes as indicated by the "X" symbols. BL0 is connected to a set of memory holes which includes the memory holes 711, 715, 717 and 719. Another example bit line BL1 is connected to a set of memory holes which includes the memory holes 710, 714, 716 and 718. The metal-filled slits 701, 702, 703 and 704 from FIG. 7A are also depicted, as they extend vertically through the stack. The bit lines can be numbered in a sequence BL0-BL23 across the DL19 layer in the −x direction.

Different subsets of bit lines are connected to cells in different rows. For example, BL0, BL4, BL8, BL12, BL16 and BL20 are connected to cells in a first row of cells at the right hand edge of each region. BL2, BL6, BL10, BL14, BL18 and BL22 are connected to cells in an adjacent row of cells, adjacent to the first row at the right hand edge. BL3, BL7, BL11, BL15, BL19 and BL23 are connected to cells in a first row of cells at the left hand edge of each region. BL1, BL5, BL9, BL13, BL17 and BL21 are connected to cells in an adjacent row of cells, adjacent to the first row at the left hand edge.

FIG. 8A depicts example NAND strings in the sub-blocks SBa-SBd of FIG. 7A, where the word lines are arranged in zones in each sub-block. The sub-blocks are consistent with the structure of FIG. 6B. The conductive layers in the stack are depicted for reference at the left hand side. Each sub-block includes multiple NAND strings, where one example NAND string is depicted. For example, SBa comprises an example NAND string NS0_SBa, SBb comprises an example NAND string NS0_SBb, SBc comprises an example NAND string NS0_SBc, and SBd comprises an example NAND string NS0_SBd.

Additionally, NS0_SBa include SGS transistors 800 and 801, dummy memory cells 802 and 803, data memory cells 804, 805, 806, 807, 808, 809, 810, 811, 812, 813 and 814, dummy memory cells 815 and 816, and SGD transistors 817 and 818.

NS0_SBb include SGS transistors 820 and 821, dummy memory cells 822 and 823, data memory cells 824, 825, 826, 827, 828, 829, 830, 831, 832, 833 and 834, dummy memory cells 835 and 836, and SGD transistors 837 and 838.

NS0_SBc include SGS transistors 840 and 841, dummy memory cells 842 and 843, data memory cells 844, 845, 846, 847, 848, 849, 850, 851, 852, 853 and 854, dummy memory cells 855 and 856, and SGD transistors 857 and 858.

NS0_SBd include SGS transistors 860 and 861, dummy memory cells 862 and 863, data memory cells 864, 865, 866, 867, 868, 869, 870, 871, 872, 873 and 874, dummy memory cells 875 and 876, and SGD transistors 877 and 878.

Memory cells on WL8 include memory cells 812, 832, 852 and 872. Memory cells on WL9 include memory cells 813, 833, 853 and 873. In this example, the programming of the block may occur sub-block by sub-block. For example, SBa may be programmed from WLL0-WLL10, then SBb may be programmed from WLL0-WLL10, then SBc may be programmed from WLL0-WLL10 and then SBd may be programmed from WLL0-WLL10.

The block includes a number of zones in each sub-block. For example, SBa includes zones SBaZ0, SBaZ1, SBaZ2 and SBaZ3. SBb includes zones SBbZ0, SBbZ1, SBbZ2 and SBbZ3. SBc includes zones SBcZ0, SBcZ1, SBcZ2 and SBcZ3. SBd includes zones SBdZ0, SBdZ1, SBdZ2 and SBdZ3. This example only has eleven data word line for simplicity. In practice, many more word lines can be used. For example, some memory devices have 64 word lines, WL0-WL63. With four zones, as an example, WL0-WL15, WL16-WL31, WL32-WL47 and WL48-WL63 can be provided in respective zones.

FIG. 8B depicts example NAND strings in the sub-blocks SBa-SBd of FIG. 7A, where the word lines are arranged in zones which extend across sub-blocks. In another possible approach, a zone extends across the sub-blocks. For example, zones Z0, Z1, Z2 and Z3 can include the memory cells of the block which are connected to WLL0 and WLL1, WLL2-WLL4, WLL5-WLL7 and WLL8-WLL10, respectively. The number of word lines in each zone can be equal, similar, or different. The zone definitions, including the zone to which each word line belongs, can be tracked using firmware on system side.

FIG. 9A is a flowchart of an example erase operation in a memory device. Step 900 includes performing an erase operation for a block of word lines. In one option, step 901 includes a first erasing mode in which an erase voltage is followed by an erase verify test for the block. A block level erase and/or verify may be used. In another option, step 902 includes a second erasing mode in which an erase voltage is followed by an erase verify test for at least one zone of the block. A zone level erase and/or verify may be used.

A block of memory cells is a unit of erase such that a set of memory cells in a block can be erased concurrently. The set of memory cells may be arranged in a plurality of NAND strings and connected to a plurality of word lines.

Typically, an erase operation comprises a number of erase loops for the block. The erase operation can occur in response to an erase command which may be issued by the state machine or other control circuit. An erase loop comprises an erase portion follow by a verify test. In the erase portion, voltages are applied to the block to provide a positive channel-to-gate voltage for each memory cell of the block to drive electrons out of the charge-storing material of the cells, thereby reducing the Vth of the cells. Various biasing schemes are discussed further below, e.g., in FIG. 11A-11E. Typically, the bit line, source line and/or control gate voltages can be set in a 3D memory device while a substrate/p-well voltage can also be set in a 2D memory device. In one approach, each memory cell is provided with the same channel-to-gate voltage.

In the verify test of the erase loop, a verify voltage is applied to the control gates of the memory cells via the word lines of the block, and sensing circuitry is used to sense currents in the NAND strings. For example, each NAND string may be connected to a respective sense circuit via a respective bit line. See, e.g., FIG. 12A-12C. The verify test is passed if at least a specified portion of the NAND strings in a block, e.g., 90%, have a current above a reference level and are thus in a conductive state. The current in each NAND string can be compared to a reference current in a verify test that occurs for each NAND string of a set of NAND strings.

In one approach, the erase-verify test may be performed by sequentially sensing sets of NAND strings which are connected to a common SGD line. For example, the sensing can be performed for one set of NAND strings, then another set of NAND strings, and so forth. For example, in the 3D memory device of FIGS. 8A and 8B, the sensing can be performed for the NAND strings in SBa, then for the NAND string in SBb and so forth. This allows a separate bit line and sensing circuitry to be connected to each NAND string being sensed at a given time. In another approach, the erase-verify test may be performed concurrently for all NAND strings in a block, such as in the 2D memory of FIG. 2.

In the first erasing mode, the verify tests may be performed for the NAND strings such that each word line has a common verify voltage. Thus, the erased states of the memory cells connected to each word line are tested during the verify test.

In the second erasing mode, the verify tests may be performed for some word lines but not others. The word lines which are tested receive the erase-verify voltage while the other word lines receive a pass voltage which provides the memory cells of the other word lines in a conductive state so they do not interference with the sensing. The second erasing mode also allows erasing of selected word lines without erasing other, unselected word lines. This can involve setting the voltage of the selected word line to provide a positive channel-to-gate voltage while floating the voltages of the unselected word lines, e.g., to avoid a positive channel-to-gate voltage. The selected word lines can be provided in zones, which are groups of word lines which may be adjacent or non-adjacent, so that an erase can occur sequentially for the zones, e.g., by erasing one or more selected zones followed by erasing one or more other selected zones, and so forth. A zone/subset can include a plurality of adjacent word lines.

A verify test can also occur sequentially for the zones, e.g., by verifying one or more selected zones followed by verifying one or more other selected zones, and so forth.

An advantage of the first erasing mode is that it provides the shortest erase time for the block since all memory cells are concurrently biased for erase and since the verify test encompasses memory cells of all word lines, in one possible implementation. An advantage of the second erasing mode is that it allows for customized erase parameters for each zone since the memory cells of a zone can be concurrently biased for erase. Further, it allows for a zone level verify test so that a particular zone which does not pass the verify test can be identified. A particular zone which does pass the verify test can also be identified. It also allows for customized verify test for a zone.

FIG. 9B is a flowchart of an example erase operation using the first erasing mode of step 901 of FIG. 9A. Step 910 begins an erase operation for a block of word lines using the first erasing mode. Step 911 involves obtaining erase parameters for the block. For example, this can include an initial erase voltage, a step size, a stabilization time for the erase voltage, an erase pulse duration, and word line voltages for use during the erase and the erase-verify. These parameters can be optimized for a block through testing. Step 912 includes applying the erase voltage to the block. Step 913 includes performing an erase-verify test for the block. A decision step 914 determines if there is a next erase loop. For example, a next loop may occur if an erase completion criterion for the block has not been met. The completion criterion may be met, e.g., if all, or at least a specified portion of the NAND strings in a block, e.g., 90%, have a current above a reference level and are thus in a conductive state, indicating that their Vth<VvEr. The completion criterion may also be met if a maximum allowable number of erase loops have been performed. If decision step 914 is true, another erase loop is performed by returning to step 912. The magnitude of the erase voltage may also be stepped up in each successive erase loop. If decision step 914 is false, a decision step 915 determines whether the erase operation has been completed (using the first erasing mode) within a maximum allowable number of erase loops.

If decision step 915 is true, a decision step 916 determined whether the number of erase loops used to complete the erasing (in the first erasing mode) equals or exceeds a threshold number of loops (e.g., six loops), which is less than the maximum allowable number (e.g., eight loops). If the threshold number of loops but not the maximum allowable number of erase loops is exceeded (decision step 916 is true), this indicates the erase speed was relatively slow, such that a switch to the second erasing mode is warranted (step 922). If decision step 916 is false, the memory device remains in the first erasing mode at step 917 and the erase operation ends at step 918.

If decision step 915 is false, this indicates a switch to the second erasing mode is warranted (step 919). Step 920 identifies one or more slow erasing zones which were the cause of the overall slow erase of the block. Step 921 optionally continues the erase operation in the second erasing mode for the one or more slow erasing zones, in an attempt to complete the erasing of the block. The continuation may involve a further maximum allowable number of erase loops. For example, in FIG. 10B, the maximum allowable number of erase loops in the first erasing mode may be eight and the maximum allowable number of erase loops in the second erasing mode may be two. For instance, in FIG. 8B or 13, it may be determined that zone Z0 or Z0A, respectively, is a slow erasing zone, in which case the continued erase of step 921 will involve the word lines of Z0 or Z0A. The voltages of the word lines in the other zones Z1, Z2 and Z3 (or Z1A, Z2A and Z3A) can be floated during the erase voltage so that they are not over-erased.

This example shows how the second erasing mode can be initiated based on a detected slow down in the erase speed of a block. It is also possible to select the second erasing mode based on other criteria, such when the memory device reaches a specified number of PE cycles. As PE cycles accumulate, the memory cells become harder to erase such that the use of the second erasing mode may be appropriate. In another approach, the second erasing mode is selected based on a count of errors when reading data from the block. The read errors are typically increased when the erase depth is inadequate. In some cases, a NAND string may pass the erase-verify test and be considered adequately erased when it includes both weakly erased memory cells and strongly erased memory cells. The weakly erased memory cells are more likely to have Er-to-A state failures.

Figure 9C:
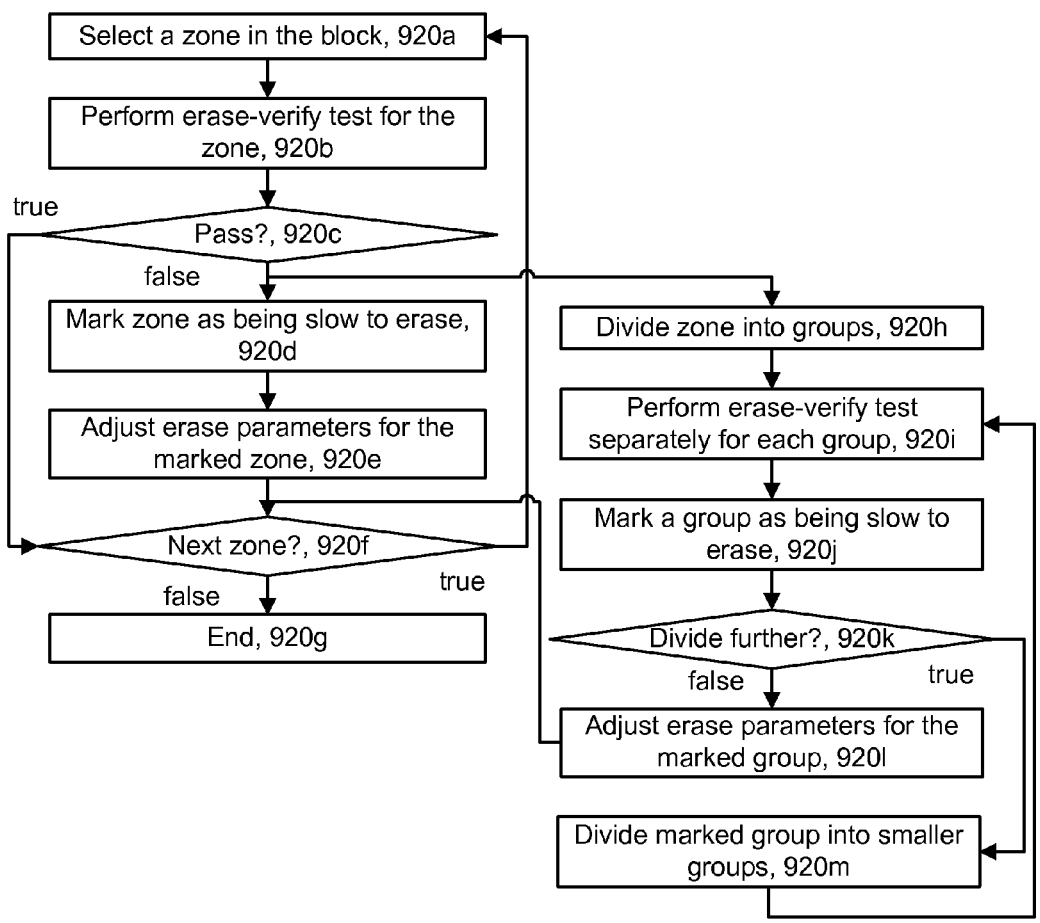
FIG. 9C is a flowchart of an example process for identifying one or more slow erasing zones, consistent with step 920 of FIG. 9B.

FIG. 9C is a flowchart of an example process for identifying one or more slow erasing zones, consistent with step 920 of FIG. 9B. Step 920a selects a zone in the block. For example, in FIG. 14A, one zone, Z0, is selected for an erase operation and three other zones, Z1, Z2 and Z3 are not selected for the erase operation.

Step 920b performs an erase-verify test for the zone. For example, VvEr can be applied to the word lines of the zone while the remaining word lines receive a pass voltage. The NAND strings are sensed to determine whether the zone is sufficiently erased to pass the verify test. A decision step 920c determines whether the verify test is passed. If decision step 920c is true, a decision step 920f determines whether there is a next zone to verify. If decision step 920f is false, the process ends at step 920g. If the decision step 920f is true, the process is repeated by selecting the next zone at step 920a.

If decision step 920c is false, step 920d marks the zone as being slow to erase. The zone may still be useable and is not marked as being bad/unusable yet, in one approach. Step 920e adjusts erase parameters for the marked zone. For example, the erase parameters may be set to provide a stronger erase of the zone, relative to initial erase parameters of the block. This can involve, e.g., increasing the initial erase voltage, step size and/or stabilization time for the erase voltage. This can also involve decreasing the word line voltages during the erase and the erase-verify. These adjusted erase parameters can be used in subsequent erase loops of a current erase operation (e.g., step 921 of FIG. 9A), or in a subsequent erase operation (e.g., FIG. 9D).

Figure 13:
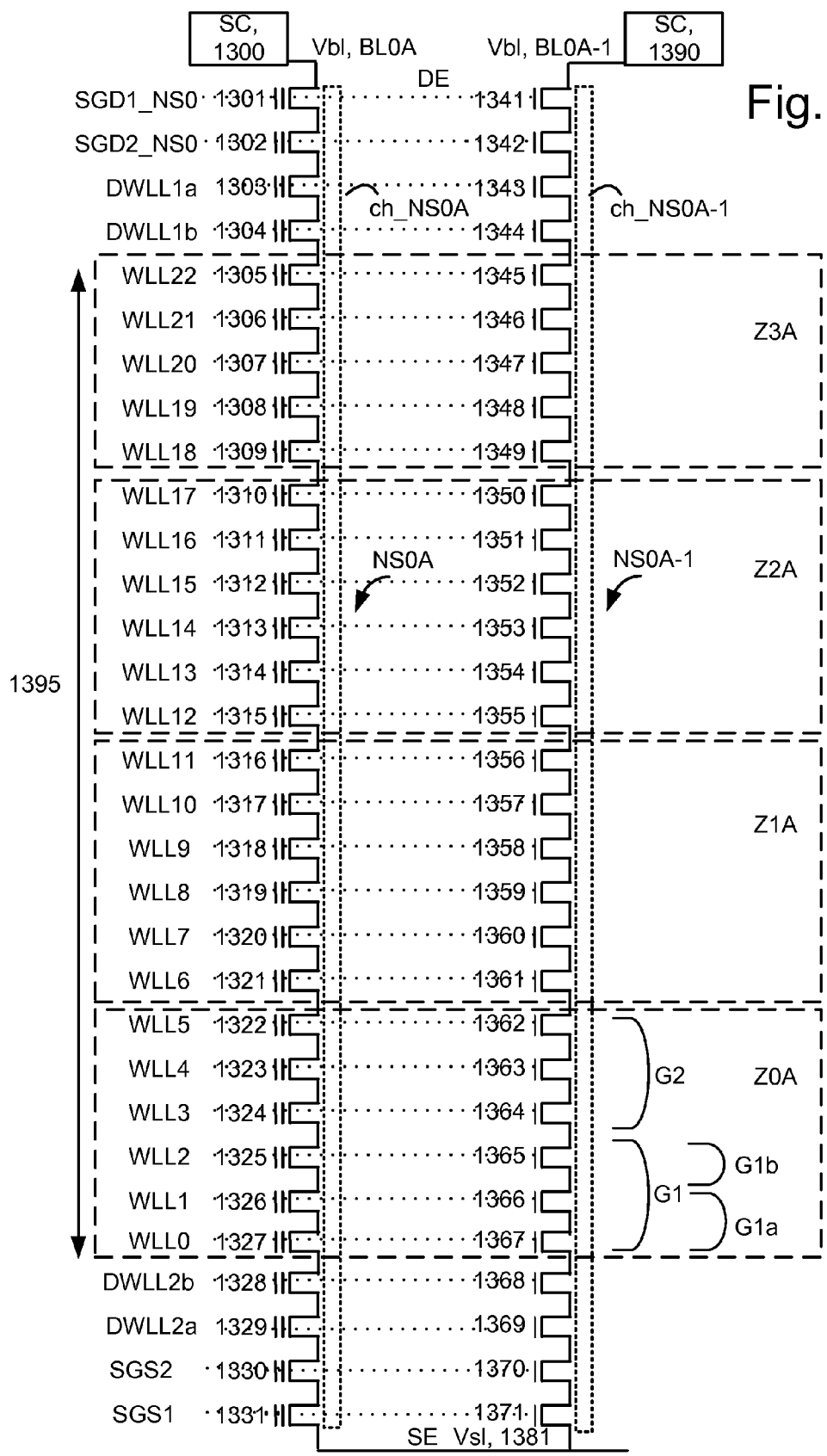
FIG. 13 depicts a circuit diagram of example NAND strings NS0A and NS0A-1.

Another option if decision step 920c is false is to perform a further evaluation of the zone which is slow to erase. This is an iterative, drill down process in which the zone is divided into smaller groups of word lines, and each group is subject to the verify test to determine if it is slow to erase. A slow-to-erase group can then be further divided into smaller groups to identify one or more word lines which are slow to erase. For example, step 920h divides the zone into two or more groups, where each group comprises one or more word lines. Referring to FIG. 13, assume the current zone is Z0A which includes WLL0-WLL5. This zone can be divided into groups G1 (WLL0-WLL2) and G2 (WLL3-WLL5). Step 920i includes performing the erase-verify test separately for each group. Step 920j includes marking a group as being slow to erase if warranted based on step 920i. Decision step 920k determines if a further division is desired. In one approach, the division continues a specified number of times. If decision step 920k is true, step 920m divides the marked group into smaller groups. For example, in FIG. 13, assume G2 passes the erase-verify test, indicating that G2 is not slow to erase, but G1 does not, indicating that G1 is slow to erase. G1 can then be divided into groups G1a (WLL0 and WWL1) and G1b (WLL2). At step 920i, each group (G1a and G1b) is tested and step 920j marks one or both groups as being slow if they fail the test. If decision step 920k is false, there is no further division and step 920l adjusts the erase parameters for the remaining one or more marked groups which are slow to erase, based on the last-defined groups. This adjustment can be similar to what was discussed in connection with step 920e, with the goal of providing a stronger erase of the identified slow-to-erase word lines.

By identifying a small group of word lines which is slow to erase, a targeted action can be taken to provider a stronger erase of these word lines in subsequent erasing, or to mark the word lines as being bad so they are not used to store data in future programming operations. One or more particular word lines, groups of word lines and/or zones which are bad can be excluded from future programming operations and erase operations.

Figure 9D:
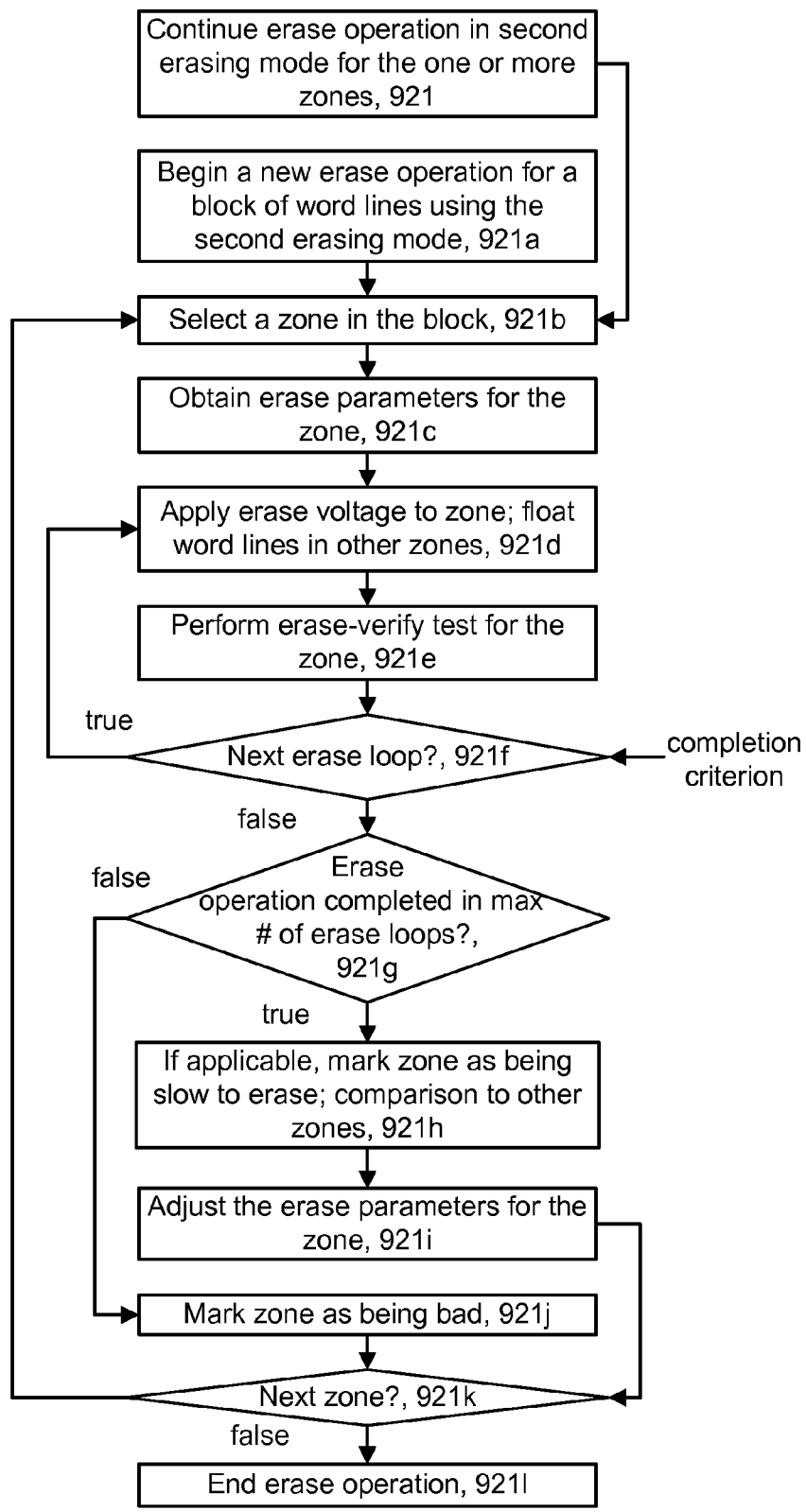
FIG. 9D is a flowchart of an example process for continuing an erase operation in a second erasing mode for one or more slow erasing zones, consistent with step 920 of FIG. 9B, and for performing a new erase operation in the second erasing mode of step 921 of FIG. 9A.

FIG. 9D is a flowchart of an example process for continuing an erase operation in a second erasing mode for one or more slow erasing zones, consistent with step 920 of FIG. 9B, and for performing a new erase operation in the second erasing mode of step 921 of FIG. 9A. Step 921 continues the erase operation in the second erasing mode for one or more slow erasing zones, such as identified in step 920 of FIG. 9B. This is the erase operation that began in the first erasing mode. Or, step 921a includes beginning a new erase operation for a block or word lines using the second erasing mode. Step 921b selects a zone in the block. Step 921c obtains the erase parameters for the zone. These erase parameters may be the initial erase parameters for the block if no optimization has been made for the zone yet. Or, these erase parameters may be optimized or customized for the zone.

Step 921d applies the erase voltage (e.g., one or more erase voltages) to the zone while floating the word lines of other zones. Step 921e performs an erase-verify test for the zone. Decision step 921f determines whether there is a next erase loop based on a completion criterion. For example, a next loop may occur if an erase completion criterion for the zone has not been met. The completion criterion may be met, e.g., if all, or at least a specified portion of the NAND strings in a block, e.g., 90%, have a current above a reference level and are thus in a conductive state, indicating that their Vth<VvEr. The completion criterion may also be met if a maximum allowable number of erase loops have been performed.

If decision step 921f is true, a next erase loop is performed for the zone starting at step 921d. The magnitude of the erase voltage may also be stepped up in each successive erase loop. If decision step 921f is false, a decision step 921g determines whether the erase operation has been completed (using the second erasing mode) within a maximum allowable number of erase loops. If decision step 921g is false, the zone is marked as being bad (step 921j). At least one zone which is marked as being bad can be excluded from future programming operations and future erase operations.

If decision step 921g is true, step 921h marks the zone as being slow, if applicable. For example the zone may be considered to be slow if the number of erase loops is at least a threshold number, which is less than the maximum allowable number. This step could also involve a comparison to the other zones. For example, FIG. 14B depicts a comparison of the erase speed of one zone, Z2, to the erase speed of adjacent zones Z1 and Z2. The erase speed may be represented by the number of erase loops used, where a higher speed corresponds with fewer loops. In one approach, the number of erase loops of a particular zone is compared to the number of erase loops of the adjacent zones, or to other zones generally, such as based on an average or median loop count of the other zones. This involves temporarily storing the other loop counts. If the number of erase loops is greater for the particular zone relative to other zones by at least a specified number of loops which is one or more loops, the particular zone may be considered to be slow erasing.

Step 921i may be used to adjust the erase parameters for the zone. This may be an initial adjustment or a further adjustment to the erase parameters. The erase parameters may be set to provide a stronger erase of the zone if the erase was completed relatively slowly, in at least threshold number of loops (e.g., six) which is less than the maximum allowable number of loops (e.g., eight). Or, the erase parameters may be set to provide a weaker erase of the zone if the erase was completed relatively quickly, in fewer than the threshold number of loops. Or, the erase parameters may be unchanged if the erase was completed within a desired range of loops, e.g., three to five loops.

A decision step 921k determines whether there is a next zone to erase. If decision step 921k is true, the next zone is selected at step 921b. If decision step 921k is false, the erase operation ends at step 921l.

Figure 10A:
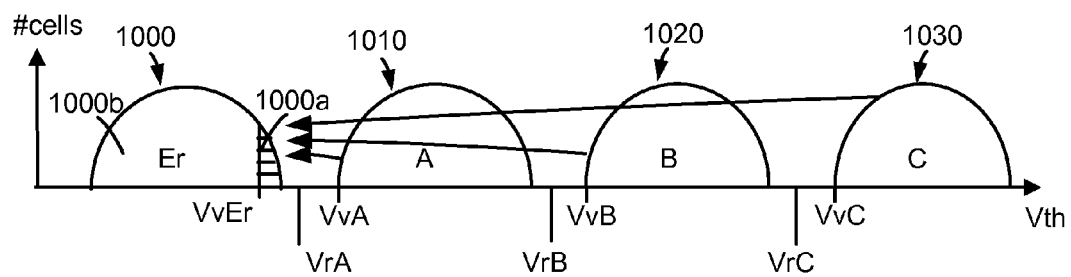
FIG. 10A depicts an example transition of Vth distributions of memory cells with four data states in an erase operation, consistent with FIG. 9A.

FIG. 10A depicts an example transition of Vth distributions of memory cells with four data states in an erase operation, consistent with FIG. 9A. The horizontal axis depicts Vth and the vertical axis depicts a number of memory cells on a logarithmic scale. Example Vth distributions for the memory cell array are provided for a case where each memory cell stores two bits of data in one of four possible Vth ranges. One bit represents the lower data and the other bit represents the upper page data. In other examples, eight or sixteen distributions are provided when three or four bits per cells are stored, A first Vth distribution 1000 is provided for erased (Er) state memory cells. Three Vth distributions 1010, 1020 and 1030 represent target data states A, B and C, respectively, which are reached by memory cells when their Vth exceeds the program-verify voltage VvA, VvB or VvC, respectively, in a programming operation. After the programming operation is completed, the data can be read from the memory cells using read reference voltages VrA, Vr and Vr which are between the Vth distributions. At the same time, a read pass voltage, Vread (e.g., 8-9 V), is applied to the remaining word lines. By testing whether the Vth of a given memory cell is above or below one or more of the read reference voltages, the system can determine the data state which is represented by a memory cell. These voltages are demarcation voltages because they demarcate between Vth ranges of different data states.

An erase operation involves one or more erase loops which lower the Vth of the memory cells. The erase operation may cause the programmed memory cells to transition from the Vth distributions 1010, 1020 and 1030 to the Vth distribution 1000 which includes a region 1000a representing memory cells with Vth>VvEr. These are the relatively slow erasing memory cells which have not passed the erase-verify test. The region 1000b represents the memory cells which passed the erase-verify test.

Figure 10B:
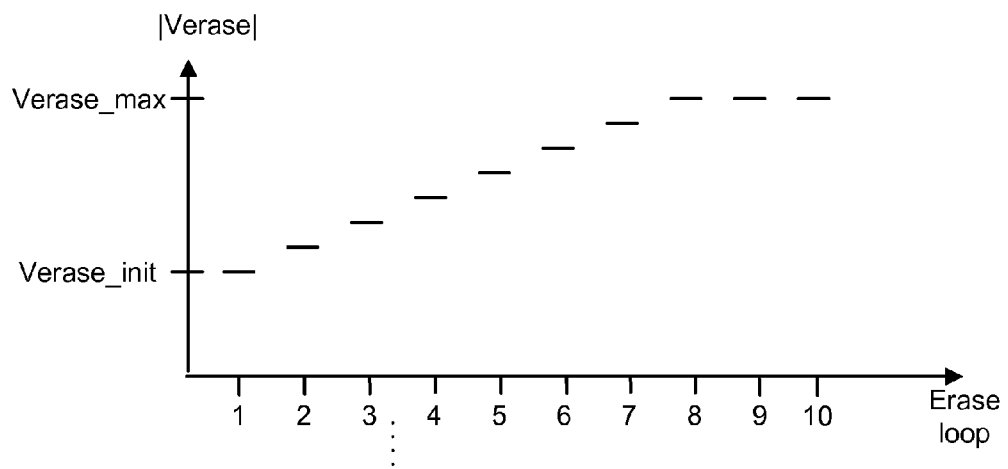
FIG. 10B depicts example erase voltages (magnitude) versus erase loop.

FIG. 10B depicts example erase voltages (magnitude) versus erase loop, such as for the erase voltages of FIGS. 11A, 11C and 11D. In this approach, the erase voltage has an initial magnitude, Verase_int, which steps up in each successive erase loop. A maximum erase voltage, Verase_max, may be reached. In one approach, after Verase_max is reached, one or more additional erase loops may be allowed, such as discussed in connection with step 921 of FIG. 9B. These additional erase loops may use Verase_max, in one approach in an attempt to erase a slow-erasing zone. Other zones may have their word line voltages floated to avoid being further erased. A maximum number of additional erase loops may be allowed before the zone is marked as being bad. For example, eight erase loops may be allowed in the first erasing mode and two additional loops allowed in the second erasing mode. Or, once the second erasing mode begins, additional erase loops may be allowed until the total number of erase loops (used in the first and second erasing modes) reaches a specified number such as ten loops. Other approaches are possible as well.

FIG. 11A depicts example voltages in an erase operation consistent with FIG. 9A, where the erase operation uses gate-induced drain leakage (GIDL) to charge up the channel of a NAND string. The vertical axis depicts voltage and the horizontal axis depicts time. The waveform 1100 depicts a series of bit line and/or source line voltages 1101, 1103 and 1105 with magnitudes of Verase1a, Verase2a and Verase3a, respectively, which step up in each erase loop. The waveform also depicts select gate voltages 1102, 1104 and 1106 with a common magnitude of Vsg_er, in one approach. In another approach, the select gate voltage also steps up with the bit line and/or source line voltage. The waveform provides a number of erase loops EL1a, EL2a and EL3a, each of which includes an erase portion and a verify portion (verify test). The channel of a NAND string can be charged up in an erase operation based on GIDL, which is generated in proportion to the drain-to-gate voltage of the select gate transistors at the drain-end and/or source-end of the NAND sting. In another option, the erase voltage steps up to its peak in two steps instead of one to allow time for the charge up of the channel to occur. In another option, the erase voltage and the select gate voltage both step up to their peaks in two steps. This approach is particularly suitable for a 3D memory device.

FIG. 11B depicts an example channel voltage consistent with FIG. 11A. FIG. 11B is time-aligned with FIG. 11A. The channel voltage (Vch) in represented by a waveform 1110 which has elevated portions 1111, 1112 and 1113 coincident with the elevated voltages of FIG. 11A. In the approach of FIGS. 11A and 11B, the word line voltage is at a level, e.g., 0 V or close to 0 V, which provides a positive channel-to-gate voltage.

FIG. 11C depicts example erase voltages in an erase operation consistent with FIG. 9A, where the erase operation applies a positive voltage to a p-well of a substrate. This approach is particularly suitable for a 2D memory device. The waveform 1120 comprises voltage pulses 1121, 1122 and 1123 with amplitudes of Verase1b, Verase2b and Verase3b, respectively, which can step up in each loop. The voltage pulses are in erase loops EL1b, EL2b and EL3b. The word line voltage may be at a level, e.g., 0 V or close to 0 V, which provides a positive channel-to-gate voltage.

FIG. 11D depicts example erase voltages in an erase operation consistent FIG. 9A, where the erase operation applies a negative voltage to the word lines in a block. In this approach, the memory device has the capability to apply a negative voltage on the word lines, such as by using a negative charge pump. In one approach, the drain (bit line) and source can be set at 0 V, and there is a positive source-to-control gate voltage of the memory cells. The waveform 1130 depicts a series of negative control gate voltages 1131, 1132 and 1133 with magnitudes of Verase1c, Verase2c and Verase3c, respectively, in erase loops EL1c, EL2c and EL3c, respectively.

FIG. 11E depicts example verify voltages in an erase operation consistent with FIG. 9A. FIG. 11E is time aligned with FIG. 11A to 11D and can be used with any of these waveforms to provide the verify test of an erase loop. The waveform 1140 includes voltage pulses 1141, 1142 or 1143 at VvEr which are applied to the word lines which are subject to the verify test. A pass voltage can be applied to any word lines which are not subject to the verify test. The erase-verify voltages can be small positive values, 0 V, or negative values.

Figure 12A:
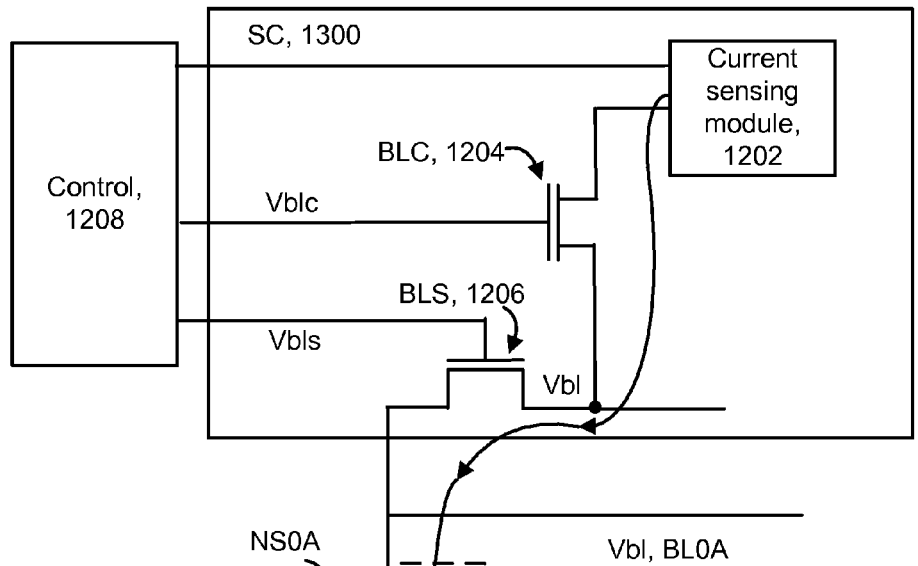
FIG. 12A depicts a configuration of the example NAND string NS0A and the sensing circuitry 1300 of FIG. 13 for use in an erase-verify test, consistent with step 913 of FIG. 9B, step 920b and 920i of FIG. 9C, and step 921e of FIG. 9D.

FIG. 12A depicts a configuration of the example NAND string NS0A and the sensing circuitry 1300 of FIG. 13 for use in an erase-verify test, consistent with, e.g., step 913 of FIG. 9B, step 920b and 920i of FIG. 9C, and step 921e of FIG. 9D. NS0A includes memory cells which are in communication with word lines WLL0, WLL1, . . . , WL22, respectively. Further, additional NAND strings are typically arranged adjacent to one another in a block or other set of non-volatile memory cells. The memory cells are coupled to a p-well region 1210 of a substrate in this example but the example is applicable generally to a 3D memory device as well which does not have such a p-well. A bit line BL0A having a voltage Vb1 is depicted, in addition to sensing circuitry 1300, which can be provided by the sense block SB1, . . . , SBp of FIG. 1.

A BLS (bit line sense) transistor 1206 which is coupled to the bit line BL0A is a high voltage transistor which is made conductive in response to a control 1208 during sense operations. The control can be provided by any of the control circuits discussed in connection with FIG. 1, for instance. A BLC (bit line clamp) transistor 1204 is a low voltage transistor which is opened in response to the control to allow the bit line to communicate with a current sensing module 1202. During a sense operation, such as an erase-verify test, a pre-charge operation occurs in which a capacitor in the current sensing module is charged. The BLC transistor may be made conductive to allow the pre-charging. Also during the sense operation, specified erase-verify voltages are applied to the word lines.

In an erase operation, an entire block may receive a common erase pulse. The verify operation can determine whether each NAND string is conductive. In one approach, all NAND strings are verified concurrently. In another possible approach, even-numbered NAND strings are verified separately from odd-numbered NAND strings. In another possible approach, sub-blocks of NAND strings are verified one sub-block at a time, where a sub-block comprises a set NAND strings, where each NAND string is connected to a different bit line.

If all NAND strings are not conductive, an additional erase pulse can be applied. Moreover, for a given NAND string, each memory cell must be conductive in order for the entire NAND string to be conductive, since the memory cells are series-connected in a NAND string.

When the erase-verify voltage is applied, a positive voltage Vs1 can be applied to the source side of the NAND string and a positive voltage Vp-well can be applied to the p-well. At the drain side of the NAND string, the BLS transistor is made conductive. Additionally, a voltage Vb1c is applied to the BLC transistor to make it conductive. The pre-charged capacitor in the current sensing module discharges through the bit line and into the source so that the source acts as a current sink, when the NAND string is conductive, e.g., when the threshold voltages of all memory cells of the NAND string have reached below the erase-verify level. This is represented by the current I_NS0A. If the threshold voltage of one or more of the memory cells in the NAND string has not reached below the erase-verify level, little no current will flow in the NAND string.

The capacitor at the drain of the NAND string may be pre-charged to a potential which exceeds a potential of the source so that a current flows through the selected non-volatile memory cell and sinks into the source when each memory cell of the NAND string is in the conductive state.

The current sensing module can sense the cell/memory cell current. In one possible approach, the current sensing module determines a voltage drop which is tied to a fixed current flow by the relationship $\Delta V = iCELL \cdot t/C$, where $\Delta V$ is the voltage drop, iCELL is the fixed current, t is a predetermined discharge time period and C is the capacitance of the pre-charged capacitor in the current sensing module. A greater voltage drops represent higher currents. At the end of a given discharge period, since iCELL and C are fixed, $\Delta V$ for a given current can be determined. If the discharge is sufficiently large in a specified time, the NAND string is deemed to be conductive, so that each memory cell is also conductive. That is, the threshold voltage of each memory cell has reached below the erase-verify level. The current sensing module thus can determine whether the associated NAND string is in a conductive or non-conductive state by the level of current.

In one approach, a p-mos transistor is used to determine a level of $\Delta V$ relative to a reference value. In another possible approach, a cell current discriminator serves as a discriminator or comparator of current levels by determining whether the conduction current is higher or lower than a given reference current.

Figure 12B:
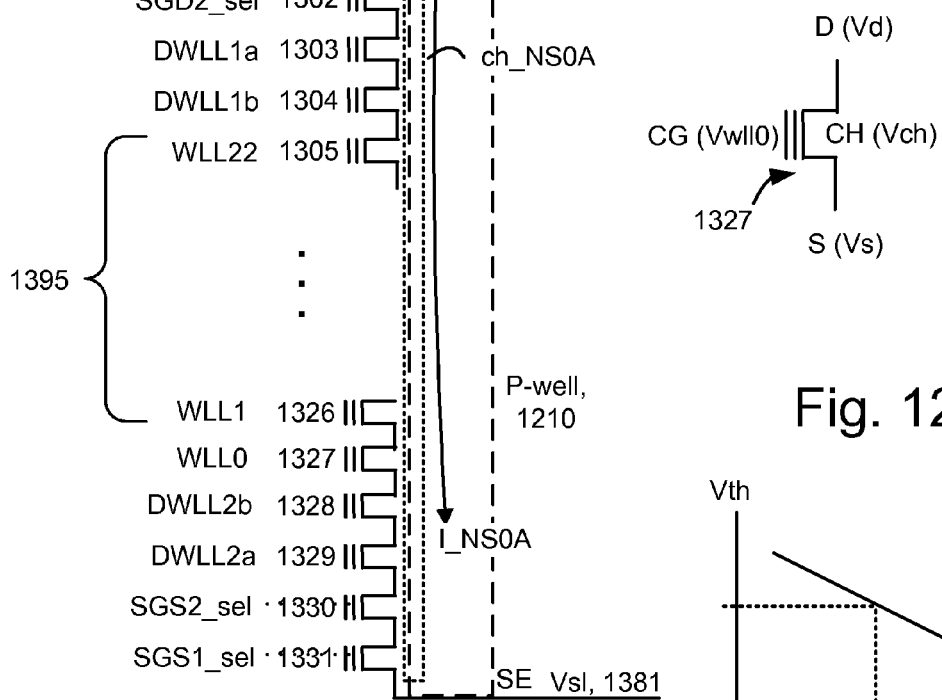
FIG. 12B depicts the example memory cell 1327 of FIGS. 12A and 13.

FIG. 12B depicts the example memory cell 1327 of FIGS. 12A and 13. The memory cell comprises a control gate CG which receives a word line voltage Vwl10, a drain at a voltage Vd, a source at a voltage Vs and a channel at a voltage Vch.

Figure 12C:
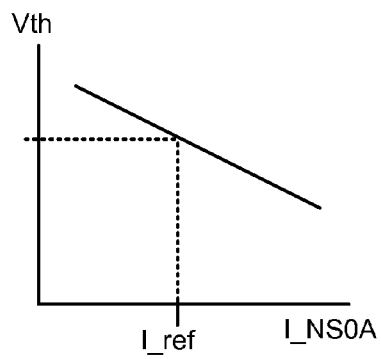
FIG. 12C depicts a plot of Vth versus I_NS0A, a current in NS0A during an erase-verify test.

FIG. 12C depicts a plot of Vth versus I_NS0A, a current in NS0A during an erase-verify test. An erase operation can include a number of erase-verify iterations which are performed until the erase operation is completed. An erase-verify iteration or erase loop includes an erase portion in which an erase voltage is applied, followed by a verify test. As mentioned, a block based verify test or zone based verify test may be used. During a verify operation for the memory cells of a NAND string, an erase-verify voltage is applied to the control gates of the memory cells while a bit line voltage is supplied using sensing circuitry. The select gate transistors and dummy memory cells are provided in a conductive state and act as pass gates. A current in the NAND string is detected and compared to a reference current, e.g., using a current comparison circuit. If the current in the NAND string exceeds the reference current, this indicates the cells in the NAND string are in a conductive state, so that their Vth, on average, is below the erase-verify level. That is, the NAND string passes the erase-verify test. On the other hand, if the current in the NAND string does not exceed the reference current, this indicates the cells in the NAND string are in a non-conductive state, so that their Vth, on average, is above the erase-verify voltage. That is, not all of the cells in the NAND string are erased and the NAND string does not pass the erase-verify test.

For a set of NAND strings, the erase operation can be considered to be completed when all, or at least a specified majority, of the NAND strings pass the erase-verify test. If the erase operation is not completed after an erase loop, another erase loop can be performed using a stronger erase voltage.

FIG. 13 depicts a circuit diagram of example NAND strings NS0A and NS0A-1 consistent with the memory devices of FIG. 3A to 3D. Example NAND strings are NS0A and NS0A-1. The word lines for data memory cells are WLL0-WLL21. WLL0-WLL21 are connected to data memory cells 1327-1305, respectively, in NS0A and to data memory cells 1367-1345, respectively, in NS0A-1. Dummy word lines DWLL1a, DWLL1b, DWLL2b and DWLL2a are connected to dummy memory cells 1303, 1304, 1328 and 1329, respectively, in NS0A and to dummy memory cells 1343, 1344, 1368 and 1369, respectively, in NS0A-1. The word lines are connected to both the selected and unselected NAND strings. An SGD line, SGD1_NS0 is connected to the SGD transistors 1301 and 1341 while an SGD line, SGD2_NS0 is connected to the SGD transistors 1302 and 1342.

An SGS line, SGS1 is connected to the SGS transistors 1331 and 1371, and an SGS line, SGS2 is connected to the SGS transistors 1330 and 1370.

A channel of NS0A is ch_NS0A and a channel of NS0A-1 is ch_NS0A-1. A current in the channel of NS0A is sensed by sensing circuitry (SC) 1300 via a bit line BL0A which is at a voltage, Vb1. A current in the channel of NS0A-1 is sensed by sensing circuitry (SC) 1390 via a bit line BL0A-1 which is at a voltage, Vb1.

A source line 1381 is connected to source ends of the NAND strings. Voltage drivers can be used to provide voltages on the control lines (e.g., word lines, select gate lines, bit line and source line).

A set of memory cells 1395 is provided in NS0A.

In one example, four zones are provided for an erase operation. These zones include WLL0-WLL5 (zone Z0A), WLL6-WLL11 (zone Z1A), WLL12-WLL17 (zone Z2A) and WLL18-WLL22 (zone Z3A).

Figure 14A:
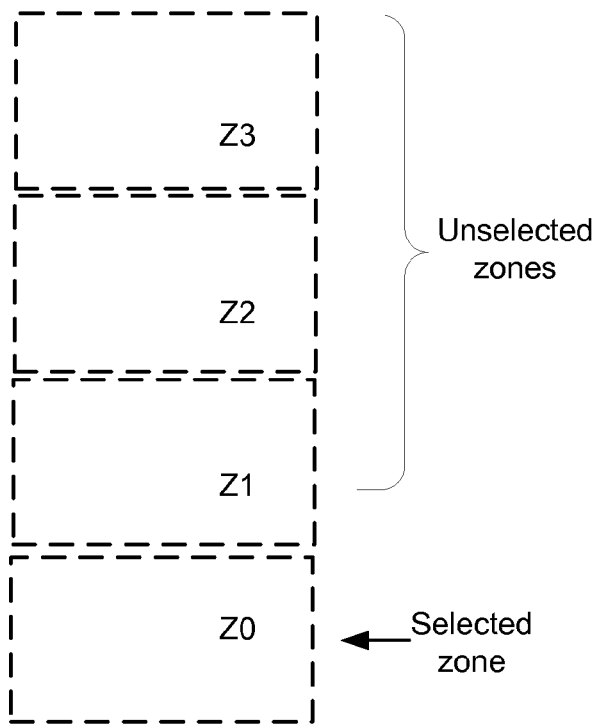
FIG. 14A depicts an example of zones in a block, where one zone, Z3, is selected for an erase operation and three other zones, Z0, Z1 and Z2 are not selected for the erase operation.
Figure 14B:
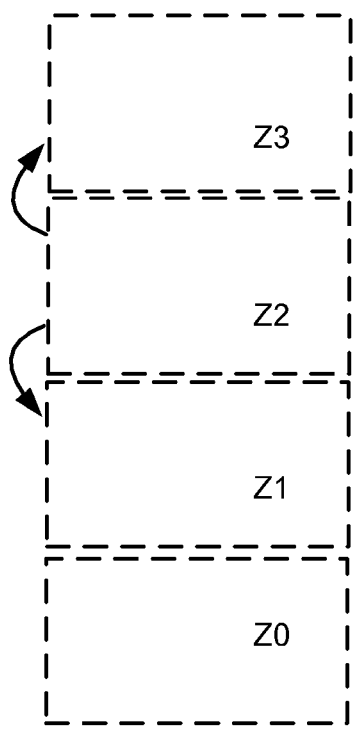
FIG. 14B depicts an example of zones in a block, and a comparison of the erase speed of one zone, Z2, to the erase speed of adjacent zones Z1 and Z2.

FIG. 14A depicts an example of zones in a block, where one zone, Z3, is selected for an erase operation and three other zones, Z0, Z1 and Z2 are not selected for the erase operation.

FIG. 14B depicts an example of zones in a block, and a comparison of the erase speed of one zone, Z2, to the erase speed of adjacent zones Z1 and Z2. As mentioned, the number of erase loops used by a zone can be compared to the number of erase loops used in neighboring zones. Similarly, the pass or fail status of a zone can be compared to the pass or fail status of neighboring zones. If one zone fails but both neighbor zones pass, this is an indication of an abnormality in the failed zone. The abnormal zone or the entire block can be marked as bad and retired to prevent data corruption.

Accordingly, it can be seen that, in one embodiment, an apparatus comprises: a block of memory cells, the block comprising memory cells connected to a plurality of word lines; and a control circuit. The control circuit is configured to: set a first erasing mode in which an erase voltage is followed by a verify test for the block in each erase loop of one or more erase loops; and decide to switch from the first erasing mode to a second erasing mode in which the plurality of word lines are arranged in a plurality of zones and an erase voltage is followed by a separate verify test for at least one zone of the plurality of zones in each erase loop of one or more additional erase loops.

In another embodiment, a method comprises: setting a first erasing mode for a block of memory cells, the block comprising memory cells connected to a plurality of word lines, wherein the block is erased using the first erasing mode and the first erasing mode determines whether the block satisfies a block erase criterion; and switching from the first erasing mode to a second erasing mode when a condition is met, wherein the condition comprises at least one of a failure of an erase operation using the first erasing mode or a number of erase loops used to complete an erase operation using the first erasing mode exceeding a specified number, the plurality of word lines are arranged in a plurality of subsets, and the second erasing mode determines whether each subset of the plurality of subsets satisfies a respective subset erase criterion.

In another embodiment, a memory device comprises means for performing each of the steps in the above-mentioned method.

In another embodiment, an apparatus comprises: a block of memory cells, the block comprising memory cells connected to a plurality of word lines, wherein the plurality of word lines are arranged in a plurality of subsets; and a control circuit. The control circuit is configured to: perform an erase operation in which an erase voltage is followed by a separate verify test for each subset of the plurality of subsets in each erase loop of one or more erase loops; identify a particular subset among the plurality of subsets which does not pass its separate verify test within a prescribed number of erase loops; based on the identifying of the particular subset, identify a particular word line within the particular subset which does not pass the separate verify test within the prescribed number of erase loops; and exclude the particular word line from future programming operations and erase operations.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a block of memory cells, the block comprising memory cells connected to a plurality of word lines; and
a control circuit, the control circuit is configured to:
set a first erasing mode in which an erase voltage is followed by a verify test for the block in each erase loop of one or more erase loops, wherein during the erase voltage in the first erasing mode, the control circuit is configured to set a voltage of the plurality of word lines which provides a positive channel-to-gate voltage for each memory cell of the plurality of word lines; and
decide to switch from the first erasing mode to a second erasing mode in which the plurality of word lines are arranged in a plurality of zones and an erase voltage is followed by a separate verify test for at least one selected zone of the plurality of zones in each erase loop of one or more additional erase loops, wherein, during the erase voltage in the second erasing mode, the control circuit is configured to set a voltage of word lines in the at least one selected zone which provides a positive channel-to-gate voltage for each memory cell of the at least one selected zone while floating a voltage of word lines in one or more unselected zones of the plurality of zones.

2. The apparatus of claim 1, wherein:
the second erasing mode follows the first erasing mode in a continuation of an erase operation.

3. The apparatus of claim 1, wherein:
the second erasing mode follows the first erasing mode in a new erase operation.

4. The apparatus of claim 1, wherein:
at least one erase parameter is customized for the at least one zone during the second erasing mode.

5. The apparatus of claim 4, wherein:
for the at least one zone, the at least one erase parameter is based on an erase speed of the zone.

6. The apparatus of claim 4, wherein:
the at least one parameter comprises at least one of an initial erase voltage, a step size, a word line voltage, an erase pulse duration or a maximum allowable number of erase loops.

7. The apparatus of claim 4, wherein:
for the at least one zone, the at least one parameter comprises a verify voltage of the separate verify test of the zone.

8. The apparatus of claim 1, wherein the control circuit is configured to:
identify the at least one zone as being relatively slow to erase compared to other zones among the plurality of zones or not being successfully erased within a maximum allowable number of erase loops; and
exclude the at least one zone from future programming operations and future erase operations.

9. The apparatus of claim 8, wherein:
the control circuit, to exclude the at least one zone from the future erase operations, is configured to float voltages of word lines in the at least one zone during the future erase operations.

10. The apparatus of claim 1, wherein the control circuit is configured to:
decide to switch from the first erasing mode to the second erasing mode when an erase operation fails in the first erasing mode.

11. The apparatus of claim 1, wherein the control circuit is configured to:
decide to switch from the first erasing mode to the second erasing mode when a number of erase loops in the first erasing mode exceeds a specified number.

12. The apparatus of claim 1, wherein the control circuit is configured to:
decide to switch from the first erasing mode to the second erasing mode when a number of program-erase cycles in the block exceeds a specified number.

13. The apparatus of claim 1, wherein:
the erase voltage of in the second erasing mode is followed by a separate verify test for each zone of the plurality of zones in each erase loop of the one or more additional erase loops.

14. A method, comprising:
setting a first erasing mode for a block of memory cells, the block comprising memory cells connected to a plurality of word lines and arranged in NAND strings, wherein the block is erased using the first erasing mode, the first erasing mode determines whether the block satisfies a block erase criterion, and the block erase criterion is satisfied if at least a specified portion of the NAND strings have a current above a reference level when an erase-verify voltage is applied to each of the plurality of word lines; and
switching from the first erasing mode to a second erasing mode when a condition is met, wherein the condition comprises at least one of a failure of an erase operation using the first erasing mode or a number of erase loops used to complete an erase operation using the first erasing mode exceeding a specified number, the plurality of word lines are arranged in a plurality of subsets, the second erasing mode determines whether each subset of the plurality of subsets satisfies a respective subset erase criterion, and the respective subset erase criterion is satisfied if at least a specified portion of the NAND strings have a current above a reference level when an erase-verify voltage is applied to the word lines of the subset while a pass voltage is applied to other word lines of the block.

15. The method of claim 14, further comprising:
for at least one subset, determining a number of erase loops used to erase the subset, and, based on the number, setting a customized erase parameter for the subset for subsequent use in erasing the subset in the second erasing mode.

16. The method of claim 14, further comprising:
during the second erasing mode, identifying a particular subset which is relatively slow to erase compared to other subsets among the plurality of subsets; and
excluding the particular subset from future programming operations and future erase operations.

17. An apparatus, comprising:
a block of memory cells, the block comprising memory cells connected to a plurality of word lines, wherein the plurality of word lines are arranged in a plurality of subsets; and
a control circuit, the control circuit is configured to:
perform an erase operation in which an erase voltage is followed by a separate verify test for each subset of the plurality of subsets in each erase loop of one or more erase loops;
identify a particular subset among the plurality of subsets which does not pass its separate verify test within a prescribed number of erase loops;
based on the identifying of the particular subset, identify a particular word line within the particular subset which does not pass the separate verify test within the prescribed number of erase loops; and
exclude the particular word line from future programming operations and erase operations.

18. The apparatus of claim 17, wherein:
the control circuit, to identify the particular word line, is configured to divide the particular subset into smaller groups of word lines and identify a particular group within the smaller groups which does not pass the separate verify test within the prescribed number of erase loops.

19. The apparatus of claim 17, wherein:
each subset comprises a plurality of adjacent word lines.

20. The apparatus of claim 17, wherein:
the block comprises a three-dimensional structure in which the memory cells are arranged along vertical memory holes;
the vertical memory holes have varying diameters; and
each subset is associated with portions of the vertical memory holes having similar diameters.

* * * * *